United States Patent
Zhang et al.

(10) Patent No.: US 10,992,315 B2
(45) Date of Patent: Apr. 27, 2021

(54) BIT BLOCK STREAM BIT ERROR DETECTION METHOD AND DEVICE

(71) Applicant: Huawei Technologies Co., Ltd., Shenzhen (CN)

(72) Inventors: Xiaojun Zhang, Shenzhen (CN); Qiwen Zhong, Shenzhen (CN); Jing Huang, Shenzhen (CN); Min Zha, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/692,151

(22) Filed: Nov. 22, 2019

(65) Prior Publication Data

US 2020/0091932 A1 Mar. 19, 2020

Related U.S. Application Data

(63) Continuation of application No. PCT/CN2018/086326, filed on May 10, 2018.

(30) Foreign Application Priority Data

May 24, 2017 (CN) .......................... 201710374518.5
Aug. 30, 2017 (CN) .......................... 201710764932.7

(51) Int. Cl.
*H03M 13/09* (2006.01)
*G06F 11/10* (2006.01)
*H03M 13/27* (2006.01)

(52) U.S. Cl.
CPC ......... *H03M 13/098* (2013.01); *G06F 11/102* (2013.01); *G06F 11/1004* (2013.01);
(Continued)

(58) Field of Classification Search
CPC .. H03M 13/15; H03M 13/098; H03M 13/091; G06F 11/102; G06F 11/1032; H04L 1/0057; H04L 1/0061; H04L 1/0063
See application file for complete search history.

(56) References Cited

U.S. PATENT DOCUMENTS 5,491,719 A 2/1996 Sellin et al.
10,355,818 B1 * 7/2019 Jha ........................ H04L 1/0057
(Continued)

FOREIGN PATENT DOCUMENTS

| CN | 1113097 A | 12/1995 |
| CN | 1822530 A | 8/2006 |

(Continued)

OTHER PUBLICATIONS

Huawei, "Ultra-Low Latency Ethernet, Ethernet Everywhere," retrieved from https://www.itu.int/en/ITU-T/Workshops-and-Seminars/201612/Documents/slides/14-Huawei-X-Ethernet.pdf, Dec. 2016, 11 pages.
(Continued)

*Primary Examiner* — Shelly A Chase
(74) *Attorney, Agent, or Firm* — Slater Matsil, LLP

(57) ABSTRACT

A method includes: sending a first boundary bit block; sequentially sending an $I^{th}$ bit block; determining a first parity check result and a second parity check result, where a check object of the first parity check result includes m consecutive bits of each bit block in the N bit blocks, a check object of the second parity check result includes n consecutive bits of each bit block in the N bit blocks, and at least one of m and n is greater than or equal to 2; and sending a second boundary bit block, the first parity check result, and the second parity check result.

20 Claims, 20 Drawing Sheets

(52) U.S. Cl.
CPC ....... *G06F 11/1032* (2013.01); *H03M 13/091* (2013.01); *H03M 13/2707* (2013.01)

(56) References Cited

U.S. PATENT DOCUMENTS

| | | | |
|---|---|---|---|
| 2008/0104481 A1* | 5/2008 | Ito | H03M 13/15 |
| | | | 714/758 |
| 2008/0134003 A1 | 6/2008 | Chun et al. | |
| 2008/0267622 A1 | 10/2008 | Loprieno | |
| 2009/0172500 A1 | 7/2009 | Vityaev | |
| 2015/0256206 A1 | 9/2015 | Nakagata | |
| 2016/0134392 A1 | 5/2016 | Effenberger et al. | |
| 2017/0077956 A1 | 3/2017 | Hamada | |

FOREIGN PATENT DOCUMENTS

| | | |
|---|---|---|
| CN | 105634844 A | 6/2016 |
| CN | 106375151 A | 2/2017 |
| CN | 106411511 A | 2/2017 |
| JP | S6214543 A | 1/1987 |
| JP | 2008136173 A | 6/2008 |
| JP | 2010509811 A | 3/2010 |
| JP | 2010219869 A | 9/2010 |
| JP | 2017055300 A | 3/2017 |
| KR | 20120061225 A | 6/2012 |
| WO | 2005053215 A1 | 6/2005 |

OTHER PUBLICATIONS

Optical Internetworking Forum (OIF), "Flex Ethernet Implementation Agreement," IA # OIF-FLEXE-01.0, Mar. 2016, 31 pages.

* cited by examiner

| MH 8 octets with T/RXC | | | | | | | | | 0 0 0 0 0 0 0 0<br>0 1 2 3 4 5 6 7 | 0 0<br>8 9 | 1 1 1 1 1 1<br>0 1 2 3 4 5 | 1 1<br>6 7 | 1 1 2 2 2 2<br>8 9 0 1 2 3 | 2 2<br>4 5 | 2 2 3 3 3 3<br>6 7 8 9 0 1 | 3 3<br>2 3 | 3 3 3 3 4 4<br>4 5 6 7 8 9 | 4 4<br>0 1 | 4 4 4 4 4 4<br>2 3 4 5 6 7 | 4 4<br>8 9 | 5 5 5 5 5 5<br>0 1 2 3 4 5 | 5 5<br>6 7 | 5 5 6 6 6 6<br>8 9 0 1 2 3 | 6 6<br>4 5 | 2.5/5<br>10GE<br>25GE<br>Clause49 | 40GE<br>100GE<br>400GE<br>Clause82 |
|---|---|---|---|---|---|---|---|---|---|---|---|---|---|---|---|---|---|---|---|---|---|---|---|
| D0 | D1 | D2 | D3 | D4 | D5 | D6 | D7 | | 0xD0 | D1 | | D2 | | D3 | | D4 | | D5 | | D6 | | D7 | | Valid | Valid |
| C0 | C1 | C2 | C3 | C4 | C5 | C6 | C7 | | 0x1E | C0 | | C1 | | C2 | | C3 | | C4 | | C5 | | C6 | | C7 | | Valid | Valid |
| C0 | C1 | C2 | C3 | O4 | D5 | D6 | D7 | | 0x2D | C0 | | C1 | | C2 | | C3 | | O4 | | D5 | | D6 | | D7 | | Valid | Invalid |
| C0 | C1 | C2 | C3 | O4 | D5 | D6 | D7 | | 0x33 | C0 | | C1 | | C2 | | C3 | | O4 | | D5 | | D6 | | D7 | | Valid | Invalid |
| O0 | D1 | D2 | D3 | S4 | D5 | D6 | D7 | | 0x66 | D1 | | D2 | | D3 | | O0 | | D5 | | D6 | | D7 | | Valid | Invalid |
| O0 | D1 | D2 | D3 | O4 | D5 | D6 | D7 | | 0x55 | D1 | | D2 | | D3 | | O0 | | D5 | | D6 | | D7 | | Valid | Invalid |
| S0 | D1 | D2 | D3 | D4 | D5 | D6 | D7 | | 0x78 | D1 | | D2 | | D3 | | D4 | | D5 | | D6 | | D7 | | Valid | Valid |
| O0 | D1 | D2 | D3 | C4 | C5 | C6 | C7 | | 0x4B | D1 | | D2 | | D3 | | O0 | | C5 | | C6 | | C7 | | Valid | Valid |
| T0 | C1 | C2 | C3 | C4 | C5 | C6 | C7 | | 0x87 | | | C1 | | C2 | | C3 | | C4 | | C5 | | C6 | | C7 | | Valid | Valid |
| D0 | T1 | C2 | C3 | C4 | C5 | C6 | C7 | | 0x99 | D0 | | | | C2 | | C3 | | C4 | | C5 | | C6 | | C7 | | Valid | Valid |
| D0 | D1 | T2 | C3 | C4 | C5 | C6 | C7 | | 0xAA | D0 | | D1 | | | | C3 | | C4 | | C5 | | C6 | | C7 | | Valid | Valid |
| D0 | D1 | D2 | T3 | C4 | C5 | C6 | C7 | | 0xB4 | D0 | | D1 | | D2 | | | | C4 | | C5 | | C6 | | C7 | | Valid | Valid |
| D0 | D1 | D2 | D3 | T4 | C5 | C6 | C7 | | 0xCC | D0 | | D1 | | D2 | | D3 | | | | C5 | | C6 | | C7 | | Valid | Valid |
| D0 | D1 | D2 | D3 | D4 | T5 | C6 | C7 | | 0xD2 | D0 | | D1 | | D2 | | D3 | | D4 | | | | C6 | | C7 | | Valid | Valid |
| D0 | D1 | D2 | D3 | D4 | D5 | T6 | C7 | | 0xE1 | D0 | | D1 | | D2 | | D3 | | D4 | | D5 | | | | C7 | | Valid | Valid |
| D0 | D1 | D2 | D3 | D4 | D5 | D6 | T7 | | 0xFF | D0 | | D1 | | D2 | | D3 | | D4 | | D5 | | D6 | | | | Valid | Valid |
| | | | | | | | | | Reserved | R R R R R R R R R R R R R R R R R R R R R R R R R R R R R R R R R R R R R R R R R R R R R R R R R R R R R R R R R R R R R R R | | | | | | | | | | | | | | | | |

FIG. 1

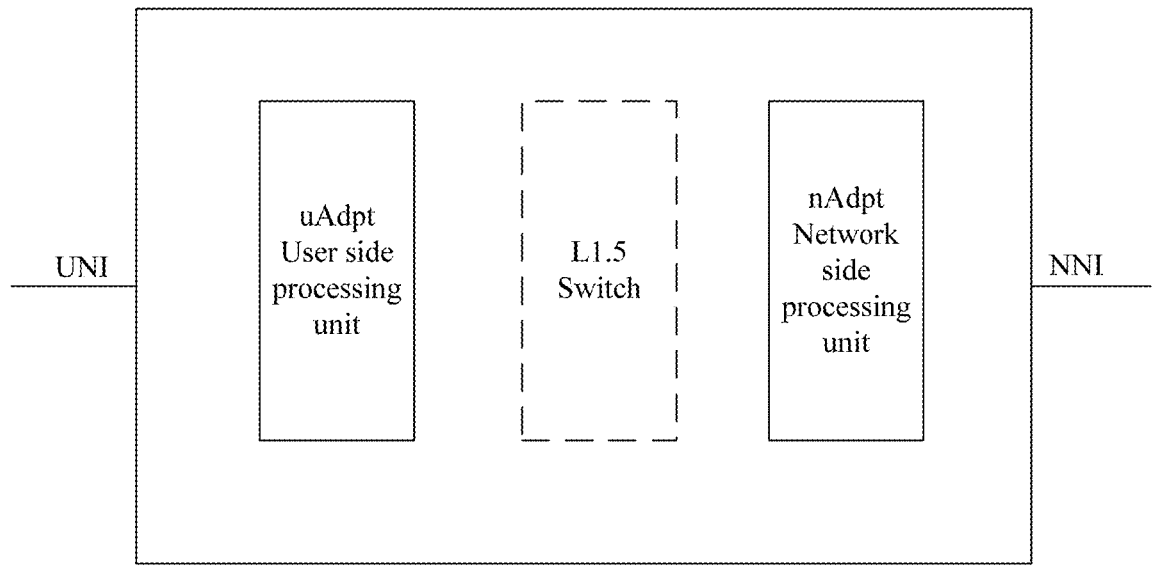
FIG. 2
FIG. 3(a)
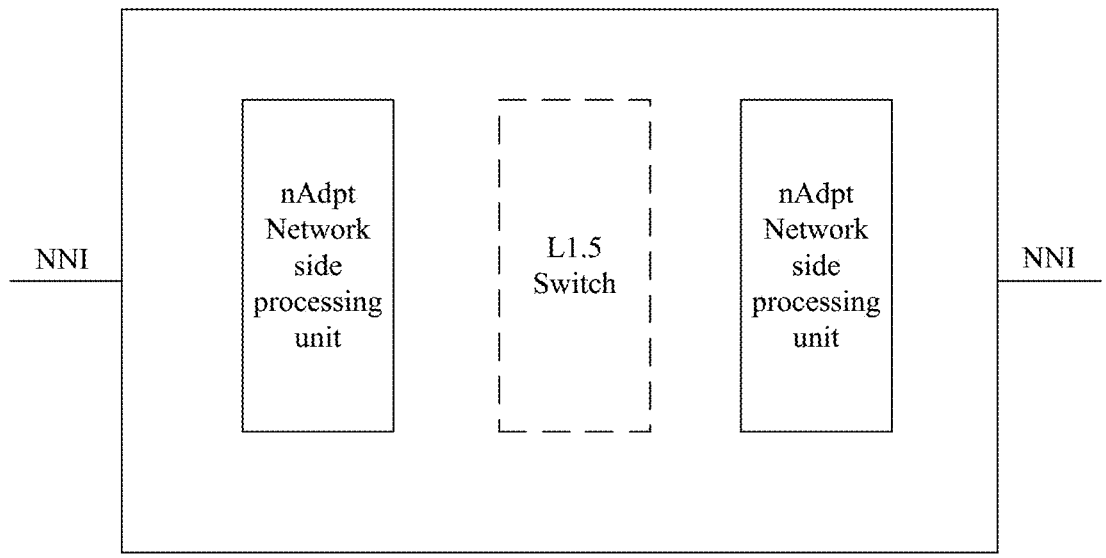
FIG. 3(b)

BIT BLOCK STREAM BIT ERROR DETECTION METHOD AND DEVICE

CROSS-REFERENCE TO RELATED APPLICATIONS

This application is a continuation of International Application No. PCT/CN2018/086326, filed on May 10, 2018, which claims priority to Chinese Patent Application No. 201710764932.7 filed on Aug. 30, 2017 and Chinese Patent Application No. 201710374518.5, filed on May 24, 2017, all of which are hereby incorporated by reference in their entireties.

TECHNICAL FIELD

This application relates to the field of communications technologies, and in particular, to a bit block stream bit error detection method and device.

BACKGROUND

In a current technology, a plurality of methods for performing bit error detection based on a packet are proposed. For example, cyclic redundancy check (CRC) detection is performed based on a packet. An error packet is determined based on a frame check sequence (FCS) field (CRC-32) of each Ethernet packet, and quality of a user channel can be evaluated by collecting statistics on a packet error rate within a period of time. However, in the foregoing manner, a bit error rate (BER) cannot be accurately measured. When there is no user service packet, a BER cannot be measured; or when there are few user service packets, it takes a long time to detect a BER.

For example, if one FCS check error in an Ethernet packet is considered as one bit error, at least 100,000 Ethernet packets need to be continuously sent, received, and detected to evaluate a BER of 1*ee-5. If user service bandwidth is 10 Mbps, the Ethernet packets are sent at full traffic, and a length of the Ethernet packets is 256 B, a detection time is at least 22.08 seconds. If user service bandwidth is only 100 Kbps, and a length of the Ethernet packets is 256 B, a detection time is at least 36.8 minutes (2,208 seconds).

As shown in Table 1, an FCS occupies four bytes. Therefore, another problem of the foregoing method is that a relatively larger quantity of fixed frame bytes are occupied and relatively low bearer efficiency is caused. If a CRC-32 check is introduced, when a minimum packet is 64 B, bearer efficiency decreases by 6.25%; or when a maximum packet is 1518 B, bearer efficiency decreases by 0.263%.

TABLE 1

| Preamble | SFD | Destination | Source | Length/Type | Data and Pad | FCS |
|---|---|---|---|---|---|---|
| 7 | 1 | 6 | 6 | 2 | 46-1,500 | 4 |

In addition, a bit error detection method using bit interleaved parity (BIP) on a per-frame basis is further proposed in the current technology. For example, a BIP check overhead byte is set in a frame structure of a synchronous digital hierarchy SDH (SDH)/an optical transport network (OTN). Therefore, bearer efficiency of this method is rigid, and a check algorithm cannot be dynamically defined according to a user requirement. For example, BIP-8 cannot be degraded to BIP-4 or upgraded to BIP-16.

Currently, a 5th generation (5G) communications technology has been widely studied in the industry, and deterministic low latency, reliability, and security isolation technologies have become important tasks to be tackled by 5G urgently. X-Ethernet (X-E for short) is a bit block switching technology based on an Ethernet physical layer, for example, a 64/66 bit block, and has a technical characteristic of deterministic ultra-low latency. Based on M/N bit block switching, X-Ethernet can perform bit error detection by using the foregoing bit error detection method. For example, the following two methods may be included:

Method 1: By using a packet-based CRC detection method, X-E arranges several bits to perform a CRC check block by block. For example, for a 66 bit block, four or eight bits may be set to perform a CRC check on other 60 or 56 bits.

Method 2: By using SDH/OTN manner, one byte or several bits are arranged to perform a BIP check block by block. For example, for a 66 bit block, two to eight bits may be set to perform a BIP check on other 62 to 56 bits.

Although the foregoing two methods can be implemented, a processing unit in a device needs to perform an operation block by block in either of the methods, and therefore the methods are difficult to implement. In addition, bearer efficiency of the foregoing two methods is relatively low. For example, if a BIP-4/CRC-4 check is performed on each block, bearer efficiency decreases by 6.25%; or if a BIP-8/CRC-8 check is performed on each block, bearer efficiency decreases by 12.5%.

SUMMARY

Embodiments of this application provide a bit block stream bit error detection method and device, to resolve problems of relatively high implementation difficulty and relatively low bearer efficiency of a bit error detection method in an M/N bit block switching scenario.

According to a first aspect, a bit block stream bit error detection method is provided, including: sending a first boundary bit block, where the first boundary bit block is used to distinguish N bit blocks to be subsequently sent, and N is a positive integer; sequentially sending an $I^{th}$ bit block, where I is an integer greater than or equal to 1 and less than or equal to N; determining a first parity check result and a second parity check result, where a check object of the first parity check result includes m consecutive bits of each bit block in the N bit blocks, a check object of the second parity check result includes n consecutive bits of each bit block in the N bit blocks, and at least one of m and n is greater than or equal to 2; and sending a second boundary bit block, the first parity check result, and the second parity check result, where the second boundary bit block is used to distinguish the N bit blocks that have been sent.

Therefore, by using the method provided in this embodiment of this application, error or bit error detection on a network path of an M/N bit block can be fully implemented, with no impact on a user service; bearer efficiency is 100%, and a bit block that is inserted or deleted due to synchronization in a transfer process can be tolerated; in addition, a detection period (that is, a quantity of bit blocks between the two boundary bit blocks) and detection precision (that is, a preset algorithm) can be dynamically configured according to a requirement. In addition, the detection method can not only be used for a to-be-checked bit block stream whose path is an end-to-end path, but can also be used for a to-be-checked bit block stream whose path is a non-end-to-end path. Therefore, by using the method provided in this embodiment of this application, problems of relatively high implementation difficulty and relatively low bearer efficiency of a bit error detection method in an M/N bit block switching scenario can be resolved.

It should be understood that, when a path of a to-be-checked bit block stream is from a bit block transmit end to a bit block receive end, or when a path of the to-be-checked bit block stream is from the bit block transmit end to any intermediate device before the bit block receive end, the foregoing method may be performed by the bit block transmit end. When the path of the to-be-checked bit block stream is from the bit block transmit end to the bit block receive end, the path of the to-be-checked bit block stream is an end-to-end path. When the path of the to-be-checked bit block stream is from the bit block transmit end to any intermediate device before the bit block receive end, the path of the to-be-checked bit block stream is a path with one end unconnected. The bit block transmit end is referred to as a transmitting device throughout this application. Therefore, this embodiment of this application can not only be used to perform bit error detection on an end-to-end path, but can also be used to perform bit error detection on a non-end-to-end path, for example, a planned reserved path, a protection path of a 1:1 connection protection group, or a path for another special purpose. When the path of the to-be-checked bit block stream is from a first intermediate device after the bit block transmit end to a second intermediate device before the bit block receive end, the foregoing method may be performed by the first intermediate device. The path of the to-be-checked bit block stream is a path with both ends unconnected.

In a possible design, a type of each bit block is an M1/M2 bit block, M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

In a possible design, the sending a first boundary bit block includes: sending the first boundary bit block to a first device; the sequentially sending an $I^{th}$ bit block includes: sequentially sending the $I^{th}$ bit block to the first device; and the sending a second boundary bit block, the first parity check result, and the second parity check result may include the following two cases: (1) The second boundary bit block, the first parity check result, and the second parity check result are sent to the first device. Therefore, in the foregoing implementation, the first parity check result and the second parity check result are sent together with the two boundary bit blocks and the N bit blocks between the two boundary bit blocks to the first device. When the path of the to-be-checked bit block stream is from the bit block transmit end to the bit block receive end, the first device herein may be the bit block receive end; or when the path of the to-be-checked bit block stream is from the bit block transmit end to any intermediate device before the bit block receive end, or when the path of the to-be-checked bit block stream is from a first intermediate device after the bit block transmit end to a second intermediate device before the bit block receive end, the first device herein may also be the intermediate device. (2) The second boundary bit block is sent to the first device, and the first parity check result and the second parity check result are sent to a second device. It should be known that the second device herein may be an SDN controller, or any device that has a function of determining a bit error in bit stream transmission. In addition, the two manners may be used herein at the same time. That is, the first parity check result and the second parity check result are sent to both the first device and the second device. Therefore, this embodiment of this application provides two optional manners, to implement bit error detection, and the bit error detection is more flexible and efficient, and simple and convenient to implement.

In a possible design, sending the second boundary bit block, the first parity check result, and the second parity check result is implemented in the following several possible manners: sending the second boundary bit block at a first moment, and sending the first parity check result and the second parity check result at a second moment, where the first moment is earlier than the second moment, or the first moment is later than the second moment, or the first moment is the same as the second moment.

In a possible design, the first parity check result and the second parity check result are stored in the second boundary bit block.

Therefore, assuming that every N bit blocks in the bit block stream form one group, an $i^{th}$ boundary bit block stores a first parity check result and a second parity check result that correspond to N bit blocks in an $i^{th}$ group, and an $(i+1)^{th}$ boundary bit block stores a first parity check result and a second parity check result that correspond to N bit blocks in an $(i+1)^{th}$ group, where the N bit blocks in the $(i+1)^{th}$ group are bit blocks between the $i^{th}$ boundary bit block and the $(i+1)^{th}$ boundary bit block, and i is a positive integer.

It should be understood that the boundary bit block mentioned in this application may be a newly inserted bit block; when a new boundary bit block is inserted, a first bit block may be deleted, to reduce impact on user bandwidth, where the first bit block is a bit block that may be inserted into the N bit blocks or deleted from the N bit blocks in a transmission process of the N bit blocks. For example, for a 64/66 bit block stream, the first bit block may be an idle block.

In a possible design, the first parity check result and the second parity check result are calculated based on a preset check algorithm, where the preset check algorithm is used to keep the first parity check result and the second parity check result unchanged when the first bit block is added to or removed from the N bit blocks, and the first bit block is a bit block that may be inserted into the N bit blocks or deleted from the N bit blocks in the transmission process of the N bit blocks. Therefore, by using the preset check algorithm provided in this embodiment of this application, it can be ensured that the first parity check result and the second parity check result can tolerate one or more first bit blocks (for example, IDLE Blocks) that are inserted or deleted in the transmission process, and a bit error occurring in the first bit block can also be detected.

In a possible design, the preset check algorithm is an xBIP-y algorithm, where x indicates a quantity of consecutive bit-interleaved bits, x is determined based on a code type definition of the first bit block, y indicates a quantity of monitoring sections, x and y are positive integers, and y≥2. For example, the preset check algorithm may be an 8BIP-8 algorithm or a 16BIP-4 algorithm. A specific method for determining the first parity check result and the second parity check result by using the xBIP-y algorithm is: sequentially recording every x consecutive bits of each bit block into a first monitoring section to a $y^{th}$ monitoring section from a first payload bit in the N bit blocks; and determining a 1-bit monitoring code for each monitoring section by using an odd parity check or an even parity check, to obtain a y-bit monitoring code, where the y-bit monitoring code includes the first parity check result and the second parity check result. Therefore, by using the xBIP-y algorithm provided in this embodiment of this application, and one or more first bit blocks that are inserted or deleted in the transmission process can be tolerated. The method is simple and convenient.

In a possible design, the preset check algorithm is a flexBIP-z algorithm, z indicates a quantity of monitoring sections, not all quantities of consecutive bit-interleaved bits corresponding to the monitoring sections are the same, and the quantities of consecutive bit-interleaved bits respectively corresponding to the z monitoring sections are A1, A2, A3, . . . , Az−1, and Az, where A1, A2, A3, . . . , Az−1, and Az, and z are positive integers, and z≥2; and a specific method for determining the first parity check result and the second parity check result by using the flexBIP-z algorithm is: recording A1 consecutive bits of each bit block into a first monitoring section from a first payload bit in the N bit blocks, recording A2 consecutive bits after the A1 consecutive bits into a second monitoring section, and recording A3 consecutive bits after the A2 consecutive bits into a third monitoring section, until Az consecutive bits after Az−1 consecutive bits are recorded into a $z^{th}$ monitoring section; and determining a 1-bit monitoring code for each monitoring section by using an odd parity check or an even parity check, to obtain a z-bit monitoring code, where the z-bit monitoring code includes the first parity check result and the second parity check result. Therefore, by using the flexBIP-z algorithm provided in this embodiment of this application, the first parity check result and the second parity check result can be determined more flexibly and simply, and one or more first bit blocks that are inserted or deleted in the transmission process can be tolerated.

In a possible design, the determining the first parity check result and the second parity check result includes: determining a first check result set, where the first check result set includes the y-bit monitoring code, or the first check result set includes the z-bit monitoring code; and the sending the first parity check result and the second parity check result includes: sending the first check result set. Therefore, by using the method provided in this embodiment of this application, error or bit error detection on a network path of an M/N bit block can be fully implemented.

According to a second aspect, a bit block stream bit error detection method is provided, including: receiving a first boundary bit block, where the first boundary bit block is used to distinguish T bit blocks to be subsequently received, and T is a positive integer; sequentially receiving an $I^{th}$ bit block, where I is an integer greater than or equal to 1 and less than or equal to T; receiving a second boundary bit block, where the second boundary bit block is used to distinguish the T bit blocks that have already been received; determining a third parity check result and a fourth parity check result, where a check object of the third parity check result includes m consecutive bits of each bit block in the T bit blocks, a check object of the fourth parity check result includes n consecutive bits of each bit block in the T bit blocks, and at least one of m and n is greater than or equal to 2; and when a first parity check result and a second parity check result are received, determining, based on the first parity check result and the third parity check result, and the second parity check result and the fourth parity check result, whether a bit error exists in the T bit blocks, where a check object of the first parity check result includes m consecutive bits of each bit block in N bit blocks, a check object of the second parity check result includes n consecutive bits of each bit block in the N bit blocks, and N indicates a quantity of bit blocks between the first boundary bit block and the second boundary bit block when the first parity check result and the second parity check result are determined. Therefore, by using the method provided in this embodiment of this application, error or bit error detection on a network path of an M/N bit block can be fully implemented, with no impact on a user service; bearer efficiency is 100%, and a bit block that is inserted or deleted due to synchronization in a transfer process can be tolerated; in addition, a detection period (that is, a quantity of bit blocks between the two boundary bit blocks) and detection precision (that is, a preset algorithm) can be dynamically configured according to a requirement. In addition, the detection method can not only be used for a to-be-checked bit block stream whose path is an end-to-end path, but can also be used for a to-be-checked bit block stream whose path is a non-end-to-end path. Therefore, by using the method provided in this embodiment of this application, problems of relatively high implementation difficulty and relatively low bearer efficiency of a bit error detection method in an M/N bit block switching scenario can be resolved.

It should be understood that, when the path of the to-be-checked bit block stream is from a bit block transmit end to a bit block receive end, steps in FIG. 13 may be performed by the bit block receive end; or when the path of the to-be-checked bit block stream is from the bit block transmit end to any intermediate device before the bit block receive end, or when the path of the to-be-checked bit block stream is from the bit block transmit end to the bit block receive end, the foregoing method may be performed by the intermediate device. The bit block receive end is referred to as a receiving device throughout this application.

It should be known that the N bit blocks herein are bit blocks between the first boundary bit block and the second boundary bit block when a transmitting device determines the first parity check result and the second parity check result. In an optional embodiment, after sending the first boundary bit block, the transmitting device sequentially sends the N bit blocks, then calculates the first parity check result and the second parity check result based on the N bit blocks, stores the two results into the second boundary bit block, and sends the second boundary bit block. However, considering that a path from the transmitting device to the receiving device needs to pass through an asynchronous node, a first bit block may be inserted into or deleted from the N bit blocks. After receiving the first boundary bit block, the receiving device sequentially receives the T bit blocks, and then three cases may occur: N=T, or N>T (which means that the first bit block is inserted into the N bit blocks), or N<T (which means that the first bit block is deleted from the N bit blocks).

In a possible design, the method further includes: when a first parity check result and a second parity check result are not received, sending the third parity check result and the fourth parity check result to a second device, where the second device stores the first parity check result and the second parity check result. It should be known that the second device herein may be an SDN controller, or any device that has a function of determining a bit error in bit stream transmission. In addition, when the first parity check result and the second parity check result are received, the third parity check result and the fourth parity check result may also be sent to the second device. Therefore, the second device may receive the first parity check result and the second parity check result that are sent by the transmitting device, and the third parity check result and the fourth parity check result that are sent by the receiving device, and the second device determines, based on the two sets of results, whether a bit error exists in a transmission process of the bit block stream. Therefore, this embodiment of this application provides implementation of bit error detection by a third-party device, for example, an SDN controller, or any device that has a function of determining a bit error in bit stream transmission, and the bit error detection is more flexible and efficient, and simple and convenient to implement.

In a possible design, a type of each bit block is an M1/M2 bit block, M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

In a possible design, the receiving a second boundary bit block includes: receiving the second boundary bit block at a first moment; and receiving the first parity check result and the second parity check result includes: receiving the first parity check result and the second parity check result at a second moment, where the first moment is earlier than the second moment, or the first moment is later than the second moment, or the first moment is the same as the second moment.

In a possible design, the first parity check result and the second parity check result are stored in the second boundary bit block.

In a possible design, the third parity check result and the fourth parity check result are calculated based on a preset check algorithm, where the preset check algorithm is used to keep the third parity check result and the fourth parity check result unchanged when the first bit block is added to or removed from the T bit blocks, and the first bit block is a bit block that may be inserted into the T bit blocks or deleted from the T bit blocks in a transmission process of the T bit blocks. Therefore, by using the preset check algorithm provided in this embodiment of this application, it can be ensured that the first parity check result and the second parity check result can tolerate one or more first bit blocks (for example, IDLE Blocks) that are inserted or deleted in the transmission process, and a bit error occurring in the first bit block can also be detected.

In addition, it should be understood that a preset algorithm used when the receiving device determines the third parity check result and the fourth parity check result is the same as a preset algorithm used when the transmitting device determines the first parity check result and the second parity check result. Same parts are not described again.

In a possible design, the preset check algorithm is an xBIP-y algorithm, where x indicates a quantity of consecutive bit-interleaved bits, x is determined based on a code type definition of the first bit block, y indicates a quantity of monitoring sections, x and y are positive integers, and y≥2.

The determining a third parity check result and a fourth parity check result includes: sequentially recording every x consecutive bits of each bit block into a first monitoring section to a $y^{th}$ monitoring section from a first payload bit in the T bit blocks; and determining a 1-bit monitoring code for each monitoring section by using an odd parity check or an even parity check, to obtain a y-bit monitoring code, where the y-bit monitoring code includes the third parity check result and the fourth parity check result. Therefore, by using the xBIP-y algorithm provided in this embodiment of this application, and one or more first bit blocks that are inserted or deleted in the transmission process can be tolerated. The method is simple and convenient.

In a possible design, the preset check algorithm is a flexBIP-z algorithm, z indicates a quantity of monitoring sections, not all quantities of consecutive bit-interleaved bits corresponding to the monitoring sections are the same, and the quantities of consecutive bit-interleaved bits respectively corresponding to the z monitoring sections are A1, A2, A3, . . . , Az−1, and Az, where A1, A2, A3, . . . , Az−1, and Az, and z are positive integers, and z≥2; and the determining a third parity check result and a fourth parity check result includes: recording A1 consecutive bits of each bit block into a first monitoring section, recording A2 consecutive bits after the A1 consecutive bits into a second monitoring section, and recording A3 consecutive bits after the A2 consecutive bits into a third monitoring section from a first payload bit in the T bit blocks, until Az consecutive bits after Az−1 consecutive bits are recorded into a $z^{th}$ monitoring section; and determining a 1-bit monitoring code for each monitoring section by using an odd parity check or an even parity check, to obtain a z-bit monitoring code, where the z-bit monitoring code includes the third parity check result and the fourth parity check result. Therefore, by using the flexBIP-z algorithm provided in this embodiment of this application, the first parity check result and the second parity check result can be determined more flexibly and simply, and one or more first bit blocks that are inserted or deleted in the transmission process can be tolerated.

In a possible design, the determining, based on the first parity check result and the third parity check result, and the second parity check result and the fourth parity check result, whether a bit error exists in the T bit blocks includes: if it is determined that the first parity check result is the same as the third parity check result, and the second parity check result is the same as the fourth parity check result, determining that no bit error exists in the T bit blocks; or if it is determined that the first parity check result is different from the third parity check result, and/or the second parity check result is different from the fourth parity check result, determining that a bit error exists in the T bit blocks.

In a possible design, receiving the first parity check result and the second parity check result includes: receiving a first check result set, where the first check result set is calculated based on an xBIP-y algorithm, and a y-bit monitoring code included in the first check result set includes the first parity check result and the second parity check result; and the determining a third parity check result and a fourth parity check result includes: determining a second check result set, where the second check result set is calculated based on the xBIP-y algorithm, and a y-bit monitoring code included in the second check result set includes the third parity check result and the fourth parity check result; and when the first parity check result and the second parity check result are received, the determining, based on the first parity check result and the third parity check result, and the second parity check result and the fourth parity check result, whether a bit error exists in the T bit blocks includes: determining, based on the first check result set and the second check result set, whether a bit error exists in the T bit blocks. Therefore, by using the method provided in this embodiment of this application, error or bit error detection on a network path of an M/N bit block can be fully implemented.

In a possible design, receiving the first parity check result and the second parity check result includes: receiving a first check result set, where the first check result set is calculated based on the flexBIP-z algorithm, and a z-bit monitoring code included in the first check result set includes the first parity check result and the second parity check result; and the determining a third parity check result and a fourth parity check result includes: determining a second check result set, where the second check result set is calculated based on the flexBIP-z algorithm, and a z-bit monitoring code included in the second check result set includes the third parity check result and the fourth parity check result; and when the first parity check result and the second parity check result are received, the determining, based on the first parity check result and the third parity check result, and the second parity check result and the fourth parity check result, whether a bit error exists in the T bit blocks includes: determining, based on the first check result set and the second check result set, whether a bit error exists in the T bit blocks. Therefore, by using the method provided in this embodiment of this application, error or bit error detection on a network path of an M/N bit block can be fully implemented.

In a possible design, the determining, based on the first check result set and the second check result set, whether a bit error exists in the T bit blocks includes: if it is determined that the first check result set is the same as the second check result set, determining that no bit error exists in the T bit blocks; or if it is determined that the first check result set is different from the second check result set, determining that a bit error exists in the T bit blocks.

According to a third aspect, a bit block stream bit error detection method is provided, including: determining, by a first device, a to-be-detected section based on a start byte in a start block in a bit block stream and an end byte in an end block corresponding to the start block; and calculating, by the first device, a first check result based on the to-be-detected section; and sending, by the first device, the first check result and the bit block stream. For example, an algorithm used when the first device calculates the first check result may be CRC-x or BIP-x. The first check result is recorded as B, and B may be one or more bytes. Therefore, by using the method provided in this embodiment of this application, error or bit error detection on a network path of an M/N bit block can be fully implemented, with little impact on a user service; bearer efficiency is close to bearer efficiency of SDH/OTN, and superior to bearer efficiency of a bit error detection method provided in the current technology; and an implementation procedure is simple, and easy to implement.

In a possible design, the bit block stream includes at least one M1/M2 bit block, where M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

In a possible design, the sending, by the first device, the first check result and the bit block stream includes: sending, by the first device, the first check result and the bit block stream to a second device; or sending, by the first device, the first check result to a third device, and sending the bit block stream to the second device. Therefore, this embodiment of this application provides implementation of bit error detection by a third-party device, for example, an SDN controller, or any device that has a function of determining a bit error in bit stream transmission, and the bit error detection is more flexible and efficient, and simple and convenient to implement.

In a possible design, before the sending, by the first device, the first check result and the bit block stream to a second device, the method further includes: storing, by the first device, the first check result into the end block, to obtain an updated end block; or storing, by the first device, the first check result into a check result storage block, and deleting any first bit block in the bit block stream, where the check result storage block is a newly added block located before the end block, and the first bit block is a bit block that may be inserted into the bit block stream or deleted from the bit block stream in a transmission process of the bit block stream. Therefore, this embodiment of this application provides two methods for storing the first check result, and the storage methods are more flexible, and simple and convenient to implement.

In a possible design, the storing, by the first device, the first check result into the end block, to obtain an updated end block includes: when a quantity of bytes occupied by the first check result is greater than or equal to a quantity of target bytes, storing, by the first device, the first check result at a position before the end byte in the end block, moving the end byte into a newly added block after the end block based on the quantity of bytes occupied by the first check result, deleting any first bit block in the bit block stream, and using the newly added block in which the end byte is located after being moved as an updated end block; or when a quantity of bytes occupied by the first check result is less than the quantity of target bytes, storing, by the first device, the first check result at a position before the end byte in the end block, backward moving, based on the quantity of bytes occupied by the first check result, the end byte by the quantity of bytes occupied by the first check result, and using a bit block in which the end byte is located after being moved as an updated end block, where the quantity of target bytes is 1 plus a quantity of bytes located after the end byte in the end block. Therefore, by using the method provided in this embodiment of this application, implementation is simple and convenient.

According to a fourth aspect, a bit block stream bit error detection method is provided, including: determining, by a second device, a to-be-detected section based on a start byte in a start block in a bit block stream and an end byte in an end block corresponding to the start block; calculating, by the second device, a second check result based on the to-be-detected section; and when the second device receives a first check result, determining, by the second device based on the first check result and the second check result, whether a bit error exists in the to-be-detected section. Therefore, by using the method provided in this embodiment of this application, error or bit error detection on a network path of an M/N bit block can be fully implemented, with little impact on a user service; bearer efficiency is close to bearer efficiency of SDH/OTN, and superior to bearer efficiency of a bit error detection method provided in the current technology; and an implementation procedure is simple, and easy to implement.

An algorithm used when the second device calculates the second check result is the same as that used when a first device calculates the first check result.

In a possible design, the bit block stream includes at least one M1/M2 bit block, where M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

In a possible design, the determining, by a second device, a to-be-detected section based on a start byte in a start block in a bit block stream and an end byte in an end block corresponding to the start block includes three possible cases: (1) If the second device receives the first check result, and the first check result is stored in the end block, the second device deletes the first check result from the end block, to obtain an updated end block, and uses bytes between the start byte in the start block and an end byte in the updated end block as the to-be-detected section. (2) If the second device receives the first check result, and the first check result is stored in a check result storage block, the second device deletes the check result storage block from the bit block stream, to obtain an updated bit block stream, and uses bytes between the start byte in the start block in the updated bit block stream and the end byte in the end block as the to-be-detected section, where the check result storage block is located before the end block. In the foregoing two cases, the first check result is included in the bytes between the start byte in the start block and the end byte in the end block. Therefore, the first check result needs to be first deleted, and a remaining part is used as the to-be-detected detection. In addition, if the second device receives the first check result, and the first check result is stored in the check result storage block, the second device deletes the check result storage block from the bit block stream, to obtain the updated bit block stream, where the check result storage block is located before the end block. At the same time, to reduce impact on user bandwidth, a first bit block needs to be added after the end block. (3) If the second device does not receive the first check result, the second device uses bytes between the start byte in the start block in the bit block stream and the end byte in the end block as the to-be-detected section. In this case, the first check result is not included in the bytes between the start byte in the start block and the end byte in the end block, so that the bytes can be directly used as the to-be-detected section.

In a possible design, the method further includes: if the second device does not receive the first check result, sending, by the second device, the second check result to a third device, where the third device stores the first check result. Therefore, this embodiment of this application provides two methods for storing the first check result, and the storage methods are more flexible, and simple and convenient to implement.

In a possible design, the determining, by the second device based on the first check result and the second check result, whether a bit error exists in the to-be-detected section includes: if the second device determines that the first check result is the same as the second check result, determining that no bit error exists in the to-be-detected section; or if the second device determines that the first check result is different from the second check result, determining that a bit error exists in the to-be-detected section.

In a possible design, that the second device deletes the first check result from the end block, to obtain an updated end block includes: when a quantity of bytes occupied by the first check result is greater than or equal to a quantity of target bytes, moving, by the second device, the end byte into a bit block before the end block based on the quantity of bytes occupied by the first check result, adding a new first bit block to the bit block stream, and using the bit block in which the end byte is located after being moved as an updated end block; or when a quantity of bytes occupied by the first check result is less than the quantity of target bytes, forward moving, by the second device based on the quantity of bytes occupied by the first check result, the end byte by the quantity of bytes occupied by the first check result, and using a bit block in which the end byte is located after being moved as an updated end block, where the quantity of target bytes is 1 plus a quantity of bytes located before the end byte in the end block. Therefore, by using the method provided in this embodiment of this application, implementation is simple and convenient.

According to a fifth aspect, a bit block stream bit error detection device is provided, including a processor and a transceiver, where the transceiver is configured to send a bit block stream, and the processor is configured to complete the foregoing method according to the first aspect or any possible implementation of the first aspect based on the bit block stream sent by the transceiver.

According to a sixth aspect, a bit block stream bit error detection device is provided, including a processor and a transceiver, where the transceiver is configured to receive a bit block stream, and the processor is configured to complete the foregoing method according to the second aspect or any possible implementation of the second aspect based on the bit block stream received by the transceiver.

According to a seventh aspect, a bit block stream bit error detection device is provided, including a processor and a transceiver, where the transceiver is configured to send a bit block stream, and the processor is configured to complete the foregoing method according to the first aspect or any possible implementation of the first aspect based on the bit block stream sent by the transceiver.

According to an eighth aspect, a bit block stream bit error detection device is provided, including a processor and a transceiver, where the transceiver is configured to receive a bit block stream, and the processor is configured to complete the foregoing method according to the second aspect or any possible implementation of the second aspect based on the bit block stream received by the transceiver.

An embodiment of this application provides a new device for transferring an M1/M2 bit block stream, where a bit error detection unit, which is also referred to as a bit error rate (Bit error ratio, BER) unit, a BER for short, is newly added to the device. The unit is configured to calculate a check result and detect a bit error. A PE device includes a uAdpt, an L1.5 switch, an nAdpt, and a BER. One end of the PE device is connected to user equipment, an interface is a UNI, the other end is connected to a network device, and an interface is an NNI. A P device includes a uAdpt, an L1.5 switch, an nAdpt, and a BER, both ends of the P device are connected to a network device, and an interface is an NNI, as shown in FIG. 23(a) and FIG. 23(b).

An embodiment of this application further provides a packet bearer product, for example, an IPRAN or PTN device for which an X-E characteristic is to be provided as planned. FIG. 24 shows the packet bearer product provided in this application, and an interface board herein may be an interface card of a box-type device or an interface chip of a line card of frame-shaped equipment.

Alternatively, an embodiment of this application further provides a packet bearer product. As shown in FIG. 25, this application provides a new chip, such as an SDxxxx, that enables a BER to be built in the chip; or a field-programmable gate array (Field-Programmable Gate Array, FPGA) or a network processor (Network Processor, NP) is added between an existing interface chip such as an SDyyyy and a main control switch board, to implement a function of the BER by using the FPGA or the NP.

According to a ninth aspect, this application provides a computer-readable storage medium, where the computer-readable storage medium stores an instruction, and when running on a computer, the instruction enables the computer to perform the foregoing method according to the first aspect or any possible design of the first aspect.

According to a tenth aspect, this application further provides a computer program product including an instruction, where when running on a computer, the instruction enables the computer to perform the foregoing method according to the first aspect or any possible design of the first aspect.

BRIEF DESCRIPTION OF THE DRAWINGS

FIG. 1 is a schematic diagram of a code type definition of 64/66 bit encoding according to an embodiment of this application;

FIG. 2 is a schematic diagram of a code type definition of an idle block according to an embodiment of this application;

FIG. 3(a) is a schematic structural diagram 1 of a PE device according to an embodiment of this application;

FIG. 3(b) is a schematic structural diagram 1 of a P device according to an embodiment of this application;

DETAILED DESCRIPTION OF ILLUSTRATIVE EMBODIMENTS

Figure 4:
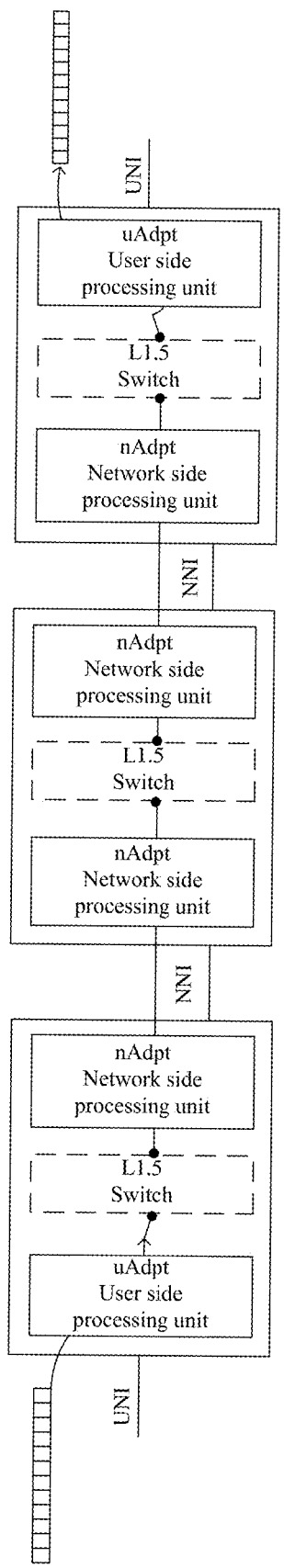
FIG. 4 is a schematic diagram of networking and forwarding using an X-E technology according to an embodiment of this application.

The following describes the embodiments of this application with reference to accompanying drawings.

A bit block mentioned in the embodiments of this application is an M1/M2 bit block (Bit block), and M1/M2 bit represents an encoding manner, where M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

It is the M1/M2 bit block stream that is transferred on an Ethernet physical layer link. For example, 1G Ethernet uses 8/10 bit encoding, and it is an 8/10 bit block stream that is transferred on a 1GE physical layer link; 10GE/40GE/100GE uses 64/66 bit encoding, and it is a 64/66 bit block stream that is transferred on a 10GE/40GE/100GE physical layer link. With the development of Ethernet technologies in the future, other encoding manners may appear, for example, 128/130 bit encoding, 256/258 bit encoding, and the like. For ease of description, the M1/M2 bit block stream is used in all the embodiments of this application.

In an L1.5 switching M1/M2 bit block stream, different types of bit blocks exist, and are clearly defined in the standard. The following uses a code type definition of 64/66 bit encoding as an example for description, as shown in FIG. 1, in which two bits "10" or "01" at a header are synchronization header bits of a 64/66 bit block, and 64 bits after the synchronization header bits are used to carry payload data or a protocol. There are 16 code type definitions in FIG. 1. Each row represents a code type definition of a bit block, where D0 to D7 represent data bytes, C0 to C7 represent control bytes, S0 represents a start byte, T0 to T7 represent end bytes, row 2 corresponds to a code type definition of an idle block (IDLE Block), and the idle block may be represented by /I/, which is specifically shown in FIG. 2. Row 7 corresponds to a code type definition of a start block, the start block may be represented by /s/, rows 9 to 16 respectively correspond to code type definitions of eight end blocks, and the eight end blocks may be uniformly represented by /T/.

Further, in an X-E technical hierarchy, devices shown in FIG. 3(a) and FIG. 3(b) are used to transfer the M1/M2 bit block stream. Specifically, as shown in FIG. 3(a) and FIG. 3(b), a PE device and a P device are included. The PE device represents a provider edge device, one end of the PE device is connected to user equipment, an interface is a user side interface (User network interface, UNI), the other end is connected to a network device, and an interface is an NNI. The P device represents a network device, both ends of the P device are connected to a network device, and an interface is a network to network interface (Network to Network interface, NNI) or an interface between devices in a network.

FIG. 3(a) is used as an example. A client signal adaptation unit (uAdpt) represents a user side processing unit of the X-E technical hierarchy, and is configured to access a user service signal, and implement code type conversion and rate adaptation. A network signal adaptation unit (nAdpt) represents a network side processing unit of the X-E technical hierarchy, and is configured to send a service signal in a device to a network side, and complete corresponding function processing; or receive a network side service signal and transmit the signal to another processing unit in the device. An L1.5 switch or an X-Ethernet switch, that is, an X-Ethernet relay (that is, forwarding by an intermediate node), is embodied as a switching unit.

FIG. 4 is a schematic diagram of networking and forwarding using an X-E technology. A path shown in FIG. 4 is an X-E end-to-end forwarding path.

In addition, the following briefly describes two common check algorithms used in the embodiments of this application.

(1) BIP-x: BIP-based algorithm, a basic idea of which is dividing a to-be-checked signal into X check blocks. For example, SDH uses BIP-16, BIP-8, and BIP-2, and OTN uses BIP-8.

Figure 5:
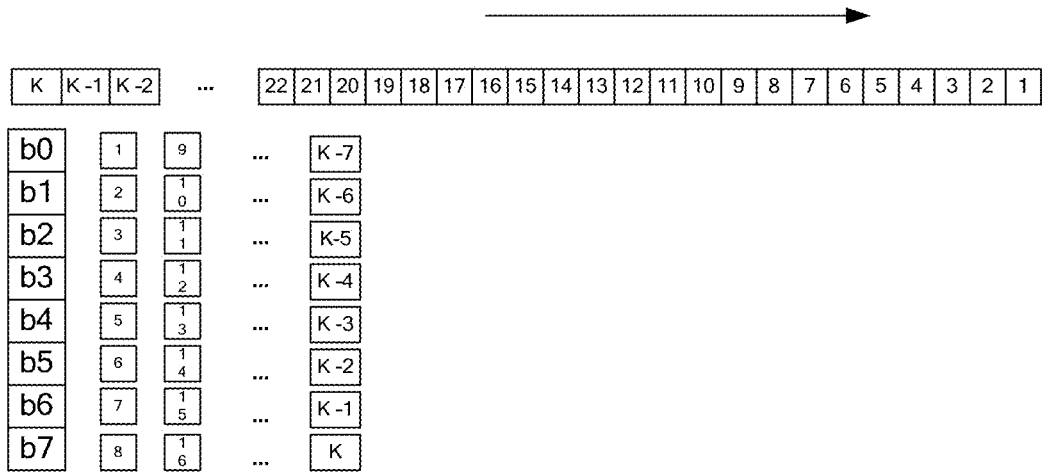
FIG. 5 is a schematic diagram of a basic idea of BIP-8 according to an embodiment of this application.

For example, referring to FIG. 5, a generation process of an 8-bit monitoring code shown in BIP-8 may be briefly described as follows: dividing all to-be-checked bits of a bit stream into a series of 8-bit sequence code groups, with eight bits for each group. A BIP-8 code is used as the first column, the first 8-bit sequence is used as the second column, and so on, forming a monitoring matrix. Then, first bits of all the 8-bit sequence code groups and a first bit of the BIP-8 code form a first monitoring code group (the first row of the matrix), second bits of all the 8-bit sequence code groups and a second bit of the BIP-8 code form a second monitoring code group (the second row of the matrix), and so on. Finally, the first bit of the BIP-8 code provides an even parity check for the first monitoring code group (that is, to keep a quantity of ones in the monitoring code group even), the second bit of the BIP-8 code provides an even parity check for the second monitoring code group, and so on. It should be known that, an odd parity check may alternatively be used herein.

(2) CRC-x: CRC-based algorithm, where standardized CRC algorithms include CRC-4, CRC-8, CRC-16, CRC-32, and the like. An X-bit cyclic check is used for a to-be-checked signal, CRC-32 is used for an Ethernet frame or packet, and a CRC-32 result is stored in the last FCS field (four bytes) of the frame or the packet.

Figure 6:
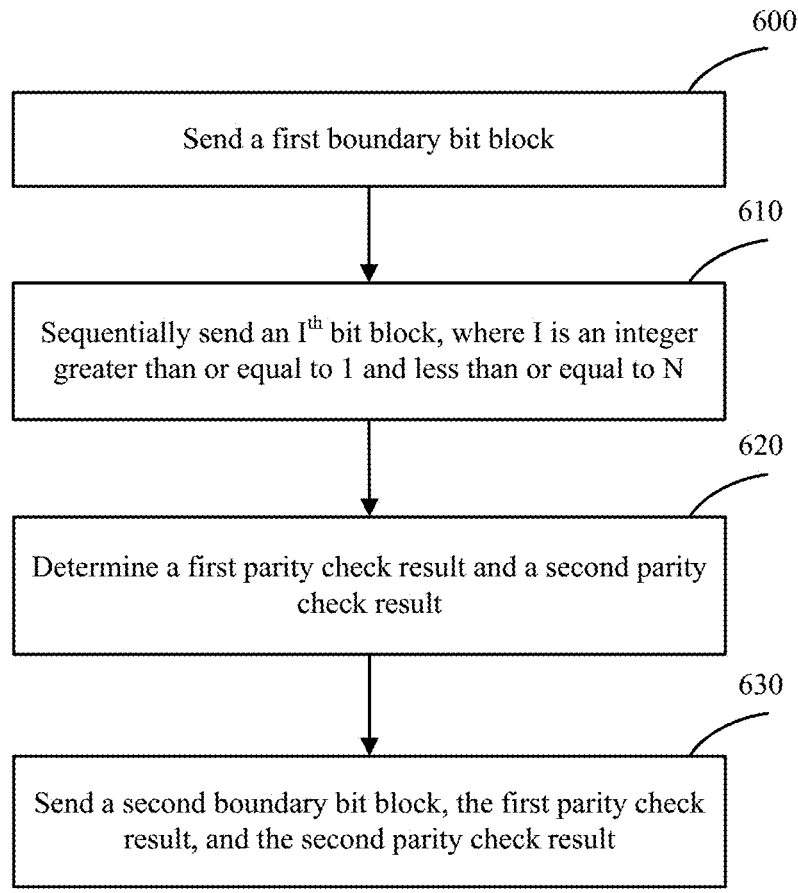
FIG. 6 shows a bit block stream bit error detection method 1 according to an embodiment of this application.

Referring to FIG. 6, an embodiment of this application provides a bit block stream bit error detection method, to resolve problems of relatively high implementation difficulty and relatively low bearer efficiency of a bit error detection method in an M/N bit block switching scenario. The method includes the following steps.

Step 600: Send a first boundary bit block, where the first boundary bit block is used to distinguish N bit blocks to be subsequently sent, and N is a positive integer.

Step 610: Sequentially send an $I^{th}$ bit block, where I is an integer greater than or equal to 1 and less than or equal to N.

Step 620: Determine a first parity check result and a second parity check result, where a check object of the first parity check result includes m consecutive bits of each bit block in the N bit blocks, a check object of the second parity check result includes n consecutive bits of each bit block in the N bit blocks, and at least one of m and n is greater than or equal to 2.

Step 630: Send a second boundary bit block, the first parity check result, and the second parity check result, where the second boundary bit block is used to distinguish the N bit blocks that have been sent.

It should be understood that, when a path of a to-be-checked bit block stream is from a bit block transmit end to a bit block receive end, or when a path of the to-be-checked bit block stream is from a bit block transmit end to any intermediate device before a bit block receive end, steps in FIG. 6 may be performed by the bit block transmit end. When the path of the to-be-checked bit block stream is from the bit block transmit end to the bit block receive end, the path of the to-be-checked bit block stream is an end-to-end path. When the path of the to-be-checked bit block stream is from the bit block transmit end to any intermediate device before the bit block receive end, the path of the to-be-checked bit block stream is a path with one end unconnected. The bit block transmit end is referred to as a transmitting device throughout this application.

Therefore, this embodiment of this application can not only be used to perform bit error detection on an end-to-end path, but can also be used to perform bit error detection on a non-end-to-end path, for example, a planned reserved path, a protection path of a 1:1 connection protection group, or a path for another special purpose.

When the path of the to-be-checked bit block stream is from a first intermediate device after the bit block transmit end to a second intermediate device before the bit block receive end, the steps in FIG. 6 may be performed by the first intermediate device. The path of the to-be-checked bit block stream is a path with both ends unconnected.

For step 600, step 610, and step 630, this embodiment of this application provides the following two possible implementations:

A first possible implementation: sending the first boundary bit block to a first device; sequentially sending the $I^{th}$ bit block to the first device; and sending the second boundary bit block, the first parity check result, and the second parity check result to the first device.

Therefore, in the foregoing implementation, the first parity check result, the second parity check result, the two boundary bit blocks, and the N bit blocks between the two boundary bit blocks are sent together to the first device. When the path of the to-be-checked bit block stream is from the bit block transmit end to the bit block receive end, the first device herein may be the bit block receive end; or when the path of the to-be-checked bit block stream is from the bit block transmit end to any intermediate device before the bit block receive end, or when the path of the to-be-checked bit block stream is from the first intermediate device after the bit block transmit end to the second intermediate device before the bit block receive end, the first device herein may also be referred to as an intermediate device.

A second possible implementation: sending the first boundary bit block to a first device; sequentially sending the $I^{th}$ bit block to the first device; and sending the second boundary bit block to the first device, and sending the first parity check result and the second parity check result to a second device.

It should be known that the second device herein may be an SDN controller, or any device that has a function of determining a bit error in bit stream transmission.

In addition, the two manners may be used herein at the same time. That is, the first parity check result and the second parity check result are sent not only to the first device but also to the second device.

Further, it should be understood that, the second boundary bit block is sent at a first moment, and the first parity check result and the second parity check result are sent at a second moment, where the first moment is earlier than the second moment, or the first moment is later than the second moment, or the first moment is the same as the second moment.

The check object of the first parity check result may be m consecutive bits of each bit block in the N bit blocks, and the check object of the second parity check result may be n consecutive bits of each bit block in the N bit blocks. In a possible implementation, in addition to including m consecutive bits of each bit block in the N bit blocks, the check object of the first parity check result may further include m consecutive bits of the first boundary bit block, and may further include m consecutive bits of the second boundary bit block. Likewise, in addition to including n consecutive bits of each bit block in the N bit blocks, the check object of the second parity check result may further include n consecutive bits of the first boundary bit block, and may further include n consecutive bits of the second boundary bit block.

In a possible implementation, the first parity check result and the second parity check result may be stored in the second boundary bit block. Therefore, assuming that every N bit blocks in a bit block stream form one group, an $i^{th}$ boundary bit block stores a first parity check result and a second parity check result that correspond to N bit blocks in an $i^{th}$ group, and an $(i+1)^{th}$ boundary bit block stores a first parity check result and a second parity check result that correspond to N bit blocks in an $(i+1)^{th}$ group, where the N bit blocks in the $(i+1)^{th}$ group are bit blocks between the $i^{th}$ boundary bit block and the $(i+1)^{th}$ boundary bit block, and i is a positive integer.

It should be understood that the boundary bit block mentioned in this application may be a newly inserted bit block. When a new boundary bit block is inserted, a first bit block may be deleted, where the first bit block is a bit block that may be inserted into the N bit blocks or deleted from the N bit blocks in a transmission process of the N bit blocks. For example, for a 64/66 bit block stream, the first bit block may be an idle block.

Figure 7:
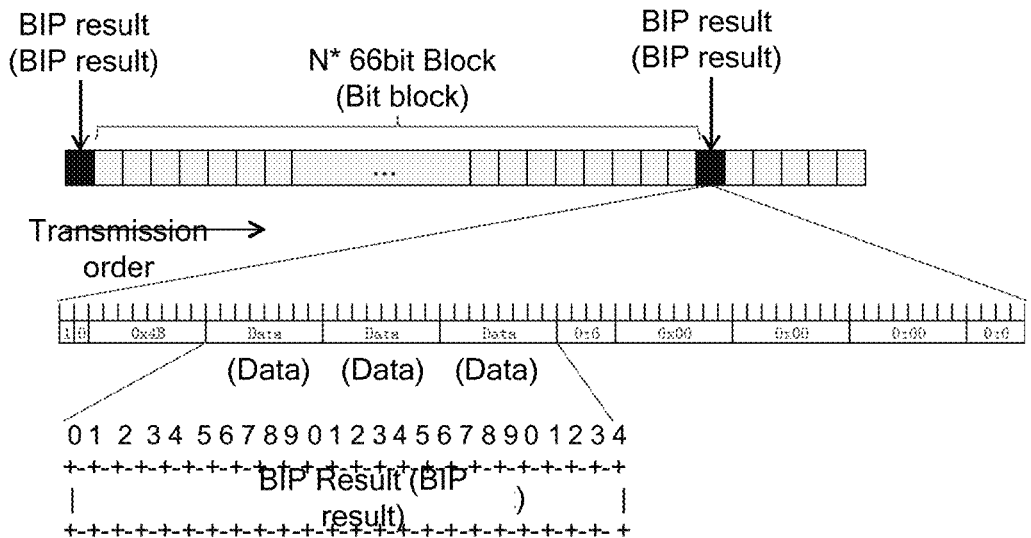
FIG. 7 is a schematic diagram of a position and a code type definition of a second boundary bit block according to an embodiment of this application.

In an optional embodiment, as shown in FIG. 7, a 64/66 bit block stream is used as an example. After the first parity check result and the second parity check result are determined, the second boundary bit block corresponds to a bit block code type definition in row 8 in FIG. 1. To be specific, a type of the bit block is 0x4B, code O of the bit block is 0x06, the first parity check result and the second parity check result are stored in three data fields of the bit block, and unoccupied data field bits are padded with binary zeros.

Therefore, after the second boundary bit block is inserted into the N bit blocks, an idle block may be deleted, to reduce impact on user bandwidth.

Figure 8:
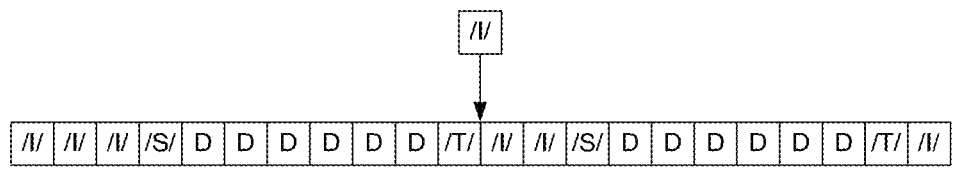
FIG. 8 is a schematic diagram of inserting a first bit block according to an embodiment of this application.

Considering that an M1/M2 bit block stream passes through an asynchronous node (which means that a receive block may not be fully synchronized with a node clock and a transmit clock) in the transmission process, a first bit block is usually inserted or deleted, to eliminate a frequency effect. For example, a 64/66 bit block stream is implemented by inserting or deleting an idle block, as shown in FIG. 8. Therefore, when the first parity check result and the second parity check result are determined in step 620, if an existing BIP-x algorithm is used, the first parity check result and the second parity check result may be affected by insertion or deletion of the first bit block in the transmission process.

In this embodiment of this application, the first parity check result and the second parity check result are calculated based on a preset check algorithm, where the preset check algorithm is used to keep the first parity check result and the second parity check result unchanged when the first bit block is added to or removed from the N bit blocks.

Specifically, to ensure that the first parity check result and the second parity check result can tolerate one or more first bit blocks (for example, IDLE Blocks) that are inserted or deleted in the transmission process, and that a bit error occurring in the first bit block can also be detected, existing BIP algorithms are improved in this application, and may include but are not limited to the following two algorithms.

Algorithm 1: The preset check algorithm is an xBIP-y algorithm, where x indicates a quantity of consecutive bit-interleaved bits, x is determined based on a code type definition of the first bit block, y indicates a quantity of monitoring sections, x and y are positive integers, and y≥2.

Every x consecutive bits of each bit block are sequentially recorded into a first monitoring section to a $y^{th}$ monitoring section from a first payload bit in N bit blocks; and a 1-bit monitoring code is determined for each monitoring section by using an odd parity check or an even parity check, to obtain a y-bit monitoring code, where the y-bit monitoring code includes the first parity check result and the second parity check result.

It should be understood that when the first parity check result and the second parity check result are calculated, synchronization header bits in each bit block are not included.

Figure 9:
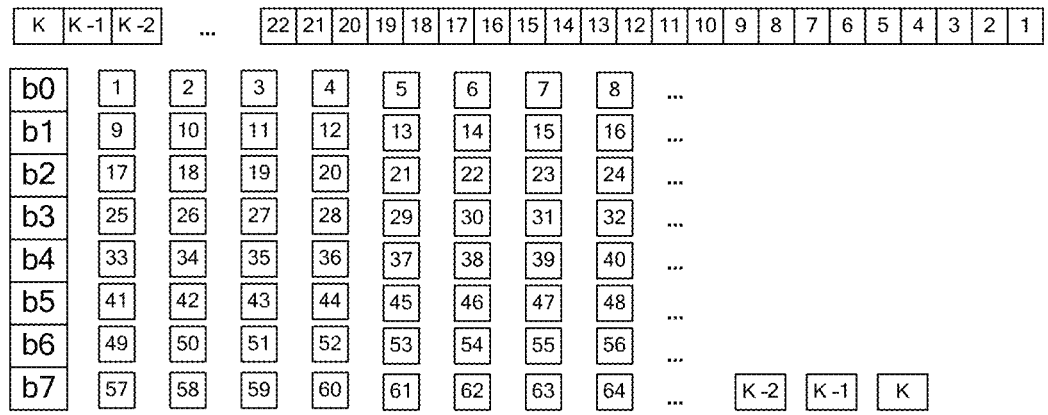
FIG. 9 is a schematic diagram of a basic idea of 8BIP-8 according to an embodiment of this application.

In an optional embodiment, as shown in FIG. 9, the existing BIP-x algorithm may be considered as a special case (that is, a scenario in which x=1) of the xBIP-y algorithm. FIG. 9 is a schematic diagram of using an 8BIP-8 algorithm for a 64/66 bit block. B0 to B7 are eight monitoring codes (also referred to as check codes) included in the used 8BIP-8 algorithm, where each monitoring code corresponds to one monitoring section, to provide an odd parity check or an even parity check for bits included in a corresponding monitoring section. Each monitoring section corresponds to eight consecutive bits of each bit block. For example, a first monitoring section corresponds to a first payload bit to an eighth payload bit of each bit block, a second monitoring section corresponds to a ninth payload bit to a sixteenth payload bit of each bit block, . . . , and an eighth monitoring section corresponds to a fifty-seventh payload bit to a sixty-fourth payload bit of each bit block. Specifically, a first byte of the inserted idle block is 0x1e, and other bytes are zeros. The first byte of the idle block enters the first monitoring section of 8BIP-8, and the other bytes enter the second to the eighth monitoring sections. 0x1e has a total of four binary ones, and other fields are zeros, and have zero binary ones. Therefore, no matter how many idle blocks are inserted or deleted in the transmission process, a check result of B0 to B7 is not affected.

Figure 10:
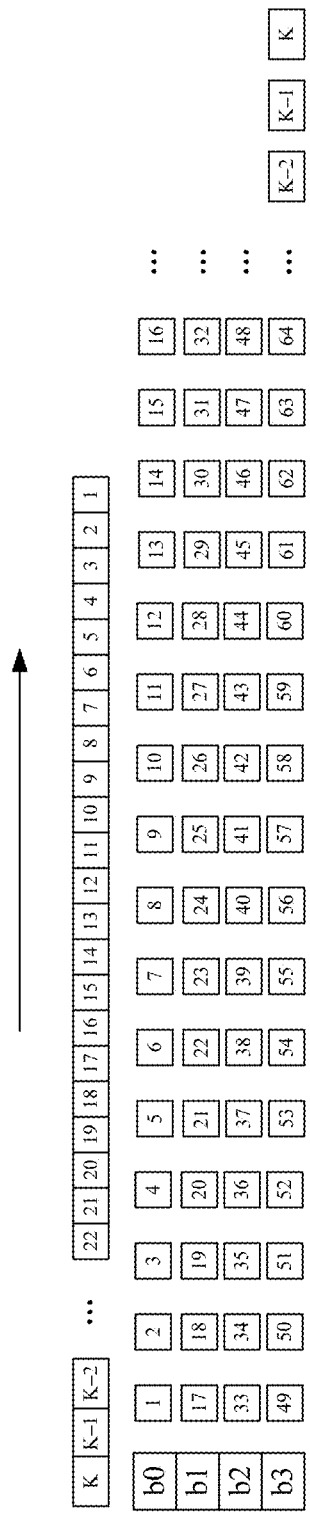
FIG. 10 is a schematic diagram of a basic idea of 16BIP-4 according to an embodiment of this application.

In an optional embodiment, as shown in FIG. 10, FIG. 10 is a schematic diagram of using a 16BIP-4 algorithm for a 64/66 bit block. B0 to B3 are four monitoring codes (also referred to as check codes) included in the used 16BIP-4 algorithm, where each monitoring code corresponds to one monitoring section, to provide an odd parity check or an even parity check for bits included in a corresponding monitoring section. Each monitoring section corresponds to 16 consecutive bits of each bit block. For example, a first monitoring section corresponds to a first payload bit to a sixteenth payload bit of each bit block, a second monitoring section corresponds to a seventeenth payload bit to a thirty-second payload bit of each bit block, a third monitoring section corresponds to a thirty-third payload bit to a forty-eighth payload bit of each bit block, and a fourth monitoring section corresponds to a forty-ninth payload bit to a sixty-fourth payload bit of each bit block.

Algorithm 2: The preset check algorithm is a flexBIP-z algorithm, z indicates a quantity of monitoring sections, not all quantities of consecutive bit-interleaved bits corresponding to the monitoring sections are the same, and the quantities of consecutive bit-interleaved bits respectively corresponding to the z monitoring sections are A1, A2, A3, ..., Az−1, and Az, where A1, A2, A3, ..., Az−1, and Az, and z are positive integers, and z≥2.

A1 consecutive bits of each bit block are recorded into a first monitoring section from a first payload bit in the N bit blocks, A2 consecutive bits after the A1 consecutive bits are recorded into a second monitoring section, and A3 consecutive bits after the A2 consecutive bits are recorded into a third monitoring section, until Az consecutive bits after Az−1 consecutive bits are recorded into a $z^{th}$ monitoring section; and a 1-bit monitoring code is determined for each monitoring section by using an odd parity check or an even parity check, to obtain a z-bit monitoring code, where the z-bit monitoring code includes the first parity check result and the second parity check result.

Figure 11A:
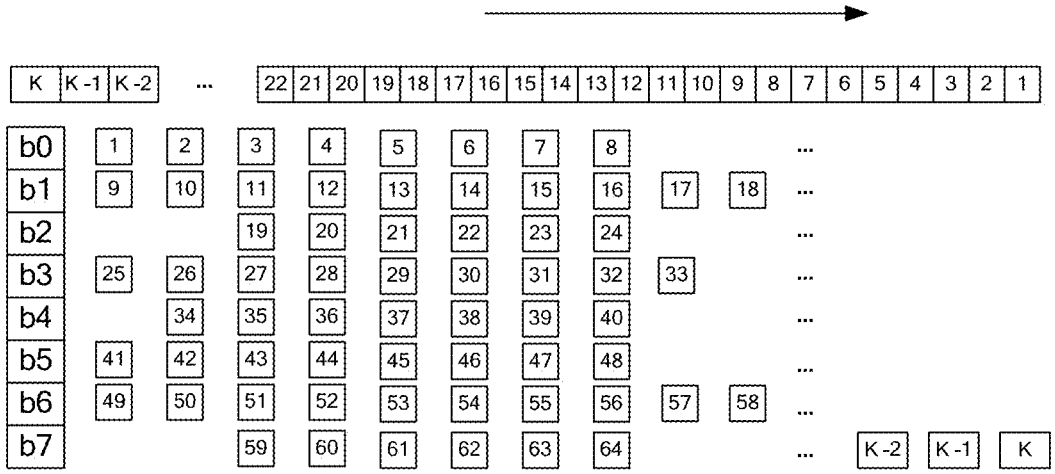
FIG. 11(a) is a schematic diagram of a basic idea of flexBIP-8 according to an embodiment of this application.

In an optional embodiment, as shown in FIG. 11(a), FIG. 11(a) is a schematic diagram of using a flexBIP-8 algorithm for a 64/66 bit block. B0 to B7 are eight monitoring codes included in the used flexBIP-8 algorithm, where each monitoring code corresponds to one monitoring section, to provide an odd parity check or an even parity check for bits included in a corresponding monitoring section. A first monitoring section corresponds to a first payload bit to an eighth payload bit of each bit block, a second monitoring section corresponds to a ninth payload bit to an eighteenth payload bit of each bit block, a third monitoring section corresponds to a nineteenth payload bit to a twenty-fourth payload bit of each bit block, a fourth monitoring section corresponds to a twenty-fifth payload bit to a thirty-third payload bit of each bit block, a fifth monitoring section corresponds to a thirty-fourth payload bit to a fortieth payload bit of each bit block, a sixth monitoring section corresponds to a forty-first payload bit to a forty-eighth payload bit of each bit block, a seventh monitoring section corresponds to a forty-ninth payload bit to a fifty-eighth payload bit of each bit block, and an eighth monitoring section corresponds to a fifty-ninth payload bit to a sixty-fourth payload bit of each bit block.

Figure 11B:
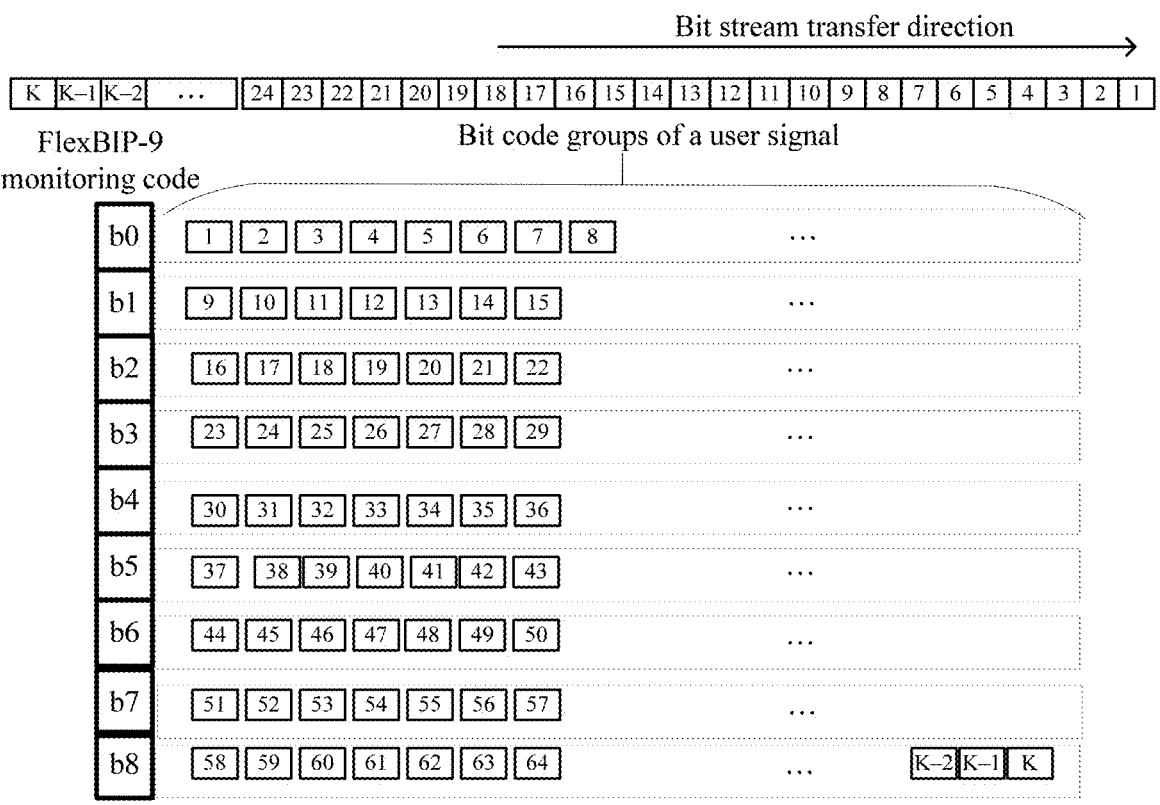
FIG. 11(b) is a schematic diagram of a basic idea of flexBIP-9 according to an embodiment of this application.

In an optional embodiment, as shown in FIG. 11(b), FIG. 11(b) is a schematic diagram of using a flexBIP-9 algorithm for a 64/66 bit block. B0 to B8 are nine monitoring codes included in the used flexBIP-9 algorithm, where each monitoring code corresponds to one monitoring section, to provide an odd parity check or an even parity check for bits included in a corresponding monitoring section. A first monitoring section corresponds to a total of seven bits ranging from a first payload bit to an eighth payload bit of each bit block, a second monitoring section corresponds to a total of seven bits ranging from a ninth payload bit to a fifteenth payload bit of each bit block, a third monitoring section corresponds to a total of seven bits ranging from a sixteenth payload bit to a twenty-second payload bit of each bit block, a fourth monitoring section corresponds to a total of seven bits ranging from a twenty-third payload bit to a twenty-ninth payload bit of each bit block, a fifth monitoring section corresponds to a total of seven bits ranging from a thirtieth payload bit to a thirty-sixth payload bit of each bit block, a sixth monitoring section corresponds to a total of seven bits ranging from a thirty-seventh payload bit to a forty-third payload bit of each bit block, a seventh monitoring section corresponds to a total of seven bits ranging from a forty-fourth payload bit to a fiftieth payload bit of each bit block, an eighth monitoring section corresponds to a total of seven bits ranging from a fifty-first payload bit to a fifty-seventh payload bit of each bit block, and a ninth monitoring section corresponds to a total of seven bits ranging from a fifty-eighth payload bit to a sixty-fourth payload bit of each bit block.

When the first parity check result and the second parity check result are determined in step 620, the check object of the first parity check result includes the N bit blocks and the first boundary bit block in step 600, and any one of nine consecutive bit groups of each bit block enters a check area corresponding to the flexBIP-9 algorithm, thereby finally forming the first parity check result. The check object of the second parity check result includes the N bit blocks and the first boundary bit block in step 600, and any one of the other eight groups, different from the one group selected by the first parity check result, in the nine consecutive bit groups of each bit block enters a check area corresponding to the flexBIP-9 algorithm, thereby finally forming the second parity check result.

When the first parity check result and the second parity check result are determined in step 620, the check object of the first parity check result includes the N bit blocks and the second boundary bit block in step 630, any one of nine consecutive bit groups of each bit block enters a check area corresponding to the flexBIP-9 algorithm, thereby finally forming the first parity check result. The check object of the second parity check result includes the N bit blocks and the second boundary bit block in step 630, any one of the other eight groups, different from the one group selected by the first parity check result, in the nine consecutive bit groups of each bit block enters a check area corresponding to the flexBIP-9 algorithm, thereby finally forming the second parity check result.

When a third parity check result and a fourth parity check result are determined in the following step 1230, a check object of the third parity check result includes T bit blocks and a first boundary bit block in step 1200, any one of nine consecutive bit groups of each bit block enters a check area corresponding to the flexBIP-9 algorithm, thereby finally forming the third parity check result. A check object of the fourth parity check result includes the T bit blocks and the first boundary bit block in step 600, and any one of the other eight groups, different from the one group selected by the third parity check result, in the nine consecutive bit groups of each bit block enters a check area corresponding to the flexBIP-9 algorithm, thereby finally forming the fourth parity check result.

When the third parity check result and the fourth parity check result are determined in step 1230, the check object of the third parity check result includes the T bit blocks and a second boundary bit block in step 1220, and any one of nine consecutive bit groups of each bit block enters a check area corresponding to the flexBIP-9 algorithm, thereby finally forming the third parity check result. The check object of the fourth parity check result includes the T bit blocks and the second boundary bit block in step 1220, and any one of the other eight groups, different from the one group selected by the third parity check result, in the nine consecutive bit groups of each bit block enters a check area corresponding to the flexBIP-9 algorithm, thereby finally forming the fourth parity check result.

Specifically, the inserted bit block is an idle block (IDLE Block), a first byte of the idle block is 0x1e, and other bytes are zeros. The first byte of the idle block enters the first monitoring section of flexBIP-9, and other bytes are grouped by seven consecutive bits, and enter the second to the ninth monitoring sections. 0x1e has a total of four binary ones, and other fields are zeros, and have zero binary ones. Therefore, no matter how many idle blocks are inserted or deleted in the transmission process, a check result of B0 to B8 is not affected.

Specifically, when the inserted bit block is a low power idle block (LPI Block), a first byte is 0x1e, other bytes are grouped by seven bits into eight groups, and each group is 0x6. The first byte of LPI enters the first monitoring section of flexBIP-9, and other bytes are grouped by seven consecutive bits, and enter the second to the ninth monitoring sections. 0x1e has a total of four binary ones, and other 7-bit fields are 0x6, and have two binary ones. Therefore, no matter how many LPI blocks are inserted or deleted in the transmission process, the check result of B0 to B8 is not affected.

Specifically, when the inserted bit block is an error block (ERROR Block), a first byte is 0x1e, other bytes are grouped by seven bits into eight groups, and each group is 0x1e. The first byte of the error block enters the first monitoring section of flexBIP-9, and other bytes are grouped by seven consecutive bits, and enter the second to the ninth monitoring sections. 0x1e has a total of four binary ones. Therefore, no matter how many error blocks are inserted or deleted in the transmission process, the check result of B0 to B8 is not affected.

Therefore, it can be learned from the two preset algorithms provided above that, the y-bit monitoring code obtained by using the algorithm 1 may be used as a first check result set; or the z-bit monitoring code obtained by using the algorithm 2 may be used as the first check result set. When the first parity check result and the second parity check result are being sent, all check results that are obtained, that is, the first check result set, may be sent together.

Figure 12:
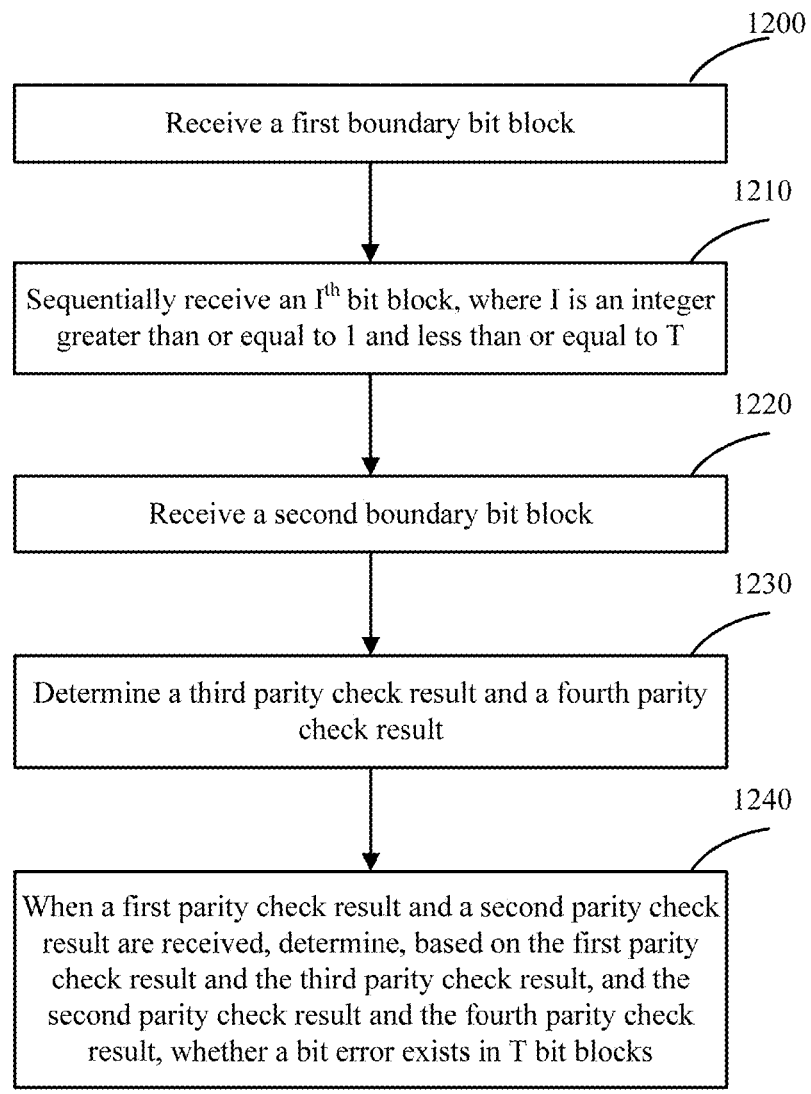
FIG. 12 shows a bit block stream bit error detection method 2 according to an embodiment of this application.

Referring to FIG. 12, an embodiment of this application provides a bit block stream bit error detection method, to resolve problems of relatively high implementation difficulty and relatively low bearer efficiency of a bit error detection method in an M/N bit block switching scenario. The method includes the following steps:

Step 1200: Receive a first boundary bit block, where the first boundary bit block is used to distinguish T bit blocks to be subsequently received, and T is a positive integer.

Step 1210: Sequentially receive an $I^{th}$ bit block, where I is an integer greater than or equal to 1 and less than or equal to T.

Step 1220: Receive a second boundary bit block, where the second boundary bit block is used to distinguish the T bit blocks that have already been received.

Step 1230: Determine a third parity check result and a fourth parity check result, where a check object of the third parity check result includes m consecutive bits of each bit block in the T bit blocks, a check object of the fourth parity check result includes n consecutive bits of each bit block in the T bit blocks, and at least one of m and n is greater than or equal to 2.

Step 1240: When a first parity check result and a second parity check result are received, determine, based on the first parity check result and the third parity check result, and the second parity check result and the fourth parity check result, whether a bit error exists in the T bit blocks, where a check object of the first parity check result includes m consecutive bits of each bit block in N bit blocks, a check object of the second parity check result includes n consecutive bits of each bit block in the N bit blocks, and N indicates a quantity of bit blocks between the first boundary bit block and the second boundary bit block when the first parity check result and the second parity check result are determined.

It should be understood that, when a path of a to-be-checked bit block stream is from a bit block transmit end to a bit block receive end, steps in FIG. 12 may be performed by the bit block receive end; or when the path of the to-be-checked bit block stream is from the bit block transmit end to any intermediate device before the bit block receive end, or when the path of the to-be-checked bit block stream is from the bit block transmit end to the bit block receive end, the steps in FIG. 12 may be performed by an intermediate device. The bit block receive end is referred to as a receiving device throughout this application.

It should be known that the N bit blocks herein are bit blocks between the first boundary bit block and the second boundary bit block when a transmitting device determines the first parity check result and the second parity check result.

In an optional embodiment, after sending the first boundary bit block, the transmitting device sequentially sends the N bit blocks, then calculates the first parity check result and the second parity check result based on the N bit blocks, stores the two results into the second boundary bit block, and sends the second boundary bit block. However, considering that a path from the transmitting device to the receiving device needs to pass through an asynchronous node, a first bit block may be inserted into or deleted from the N bit blocks. After receiving the first boundary bit block, the receiving device sequentially receives the T bit blocks, and then three cases may occur: N=T, or N>T (which means that a first bit block is inserted into the N bit blocks), or N<T (which means that a first bit block is deleted from the N bit blocks).

In a possible implementation, when a first parity check result and a second parity check result are not received, the third parity check result and the fourth parity check result are sent to a second device, where the second device stores the first parity check result and the second parity check result. It should be known that the second device herein may be an SDN controller, or any device that has a function of determining a bit error in bit stream transmission. In addition, when the first parity check result and the second parity check result are received, the third parity check result and the fourth parity check result may also be sent to the second device. Therefore, the second device may receive the first parity check result and the second parity check result that are sent by the transmitting device, and the third parity check result and the fourth parity check result that are sent by the receiving device, and the second device determines, based on the two sets of results, whether a bit error exists in a transmission process of the bit block stream.

In a possible implementation, the second boundary bit block is received at a first moment, and the first parity check result and the second parity check result are received at a second moment, where the first moment is earlier than the second moment, or the first moment is later than the second moment, or the first moment is the same as the second moment.

The check object of the third parity check result may be m consecutive bits of each bit block in the T bit blocks, the check object of the fourth parity check result may be n consecutive bits of each bit block in the T bit blocks, the check object of the first parity check result may be m consecutive bits of each bit block in the N bit blocks, and the check object of the second parity check result may be n consecutive bits of each bit block in the N bit blocks. In a possible implementation, in addition to including m consecutive bits of each bit block in the T bit blocks, the check object of the third parity check result may further include m consecutive bits of the first boundary bit block, and may further include m consecutive bits of the second boundary bit block. Likewise, in addition to including n consecutive bits of each bit block of the T bit blocks, the check object of the fourth parity check result may further include n consecutive bits of the first boundary bit block, and may further include n consecutive bits of the second boundary bit block. In addition to including m consecutive bits of each bit block in the N bit blocks, the check object of the first parity check result may further include m consecutive bits of the first boundary bit block, and may further include m consecutive bits of the second boundary bit block. Likewise, in addition to including n consecutive bits of each bit block in the N bit blocks, the check object of the second parity check result may further include n consecutive bits of the first boundary bit block, and may further include n consecutive bits of the second boundary bit block.

When the check object of the first parity check result includes m consecutive bits of the first boundary bit block, the check object of the third parity check result also needs to include m consecutive bits of the first boundary bit block; when the check object of the first parity check result includes m consecutive bits of the second boundary bit block, the check object of the third parity check result also needs to include m consecutive bits of the second boundary bit block; when the check object of the second parity check result includes n consecutive bits of the first boundary bit block, the check object of the fourth parity check result also needs to include n consecutive bits of the first boundary bit block; and when the check object of the second parity check result includes n consecutive bits of the second boundary bit block, the check object of the fourth parity check result also needs to include n consecutive bits of the second boundary bit block.

In a possible implementation, the first parity check result and the second parity check result are stored in the second boundary bit block.

In a possible implementation, a specific method for determining, by the receiving device based on the first parity check result and the third parity check result, and the second parity check result and the fourth parity check result, whether a bit error exists in the T bit blocks is: if it is determined that the first parity check result is the same as the third parity check result, and the second parity check result is the same as the fourth parity check result, determining that no bit error exists in the T bit blocks; or if it is determined that the first parity check result is different from the third parity check result, and/or the second parity check result is different from the fourth parity check result, determining that a bit error exists in the T bit blocks.

In addition, it should be understood that a preset algorithm used when the receiving device determines the third parity check result and the fourth parity check result is the same as a preset algorithm used when the transmitting device determines the first parity check result and the second parity check result. Same parts are not described again.

In a possible implementation, if the receiving device receives a first check result set, and the first check result set is calculated based on an xBIP-y algorithm, a y-bit monitoring code included in the first check result set includes the first parity check result and the second parity check result. Then, the receiving device needs to determine a second check result set, where the second parity check result set is calculated based on the xBIP-y algorithm, and a y-bit monitoring code included in the second check result set includes the third parity check result and the fourth parity check result. Further, the receiving device determines, based on the first check result set and the second check result set, whether a bit error exists in the T bit blocks.

In a possible implementation, if the receiving device receives a first check result set, and the first check result set is calculated based on a flexBIP-z algorithm, a z-bit monitoring code included in the first check result set includes the first parity check result and the second parity check result. Then, the receiving device needs to determine a second check result set, where the second check result set is calculated based on the flexBIP-z algorithm, and a z-bit monitoring code included in the second check result set includes the third parity check result and the fourth parity check result. Further, the receiving device determines, based on the first check result set and the second check result set, whether a bit error exists in the T bit blocks.

Specifically, that the receiving device determines, based on the first check result set and the second check result set, whether a bit error exists in the T bit blocks includes the following two possible cases.

(1) if it is determined that the first check result set is the same as the second check result set, determining that no bit error exists in the T bit blocks; or (2) if it is determined that the first check result set is different from the second check result set, determining that a bit error exists in the T bit blocks.

By using the method provided in this embodiment of this application, error or bit error detection on a network path of an M/N bit block can be fully implemented, with no impact on a user service; bearer efficiency is 100%, and a bit block that is inserted or deleted due to synchronization in a transfer process can be tolerated; in addition, a detection period (that is, a quantity of bit blocks between the two boundary bit blocks) and detection precision (that is, a preset algorithm) can be dynamically configured according to a requirement. In addition, the detection method can not only be used for a to-be-checked bit block stream whose path is an end-to-end path, but can also be used for a to-be-checked bit block stream whose path is a non-end-to-end path.

Figure 13:
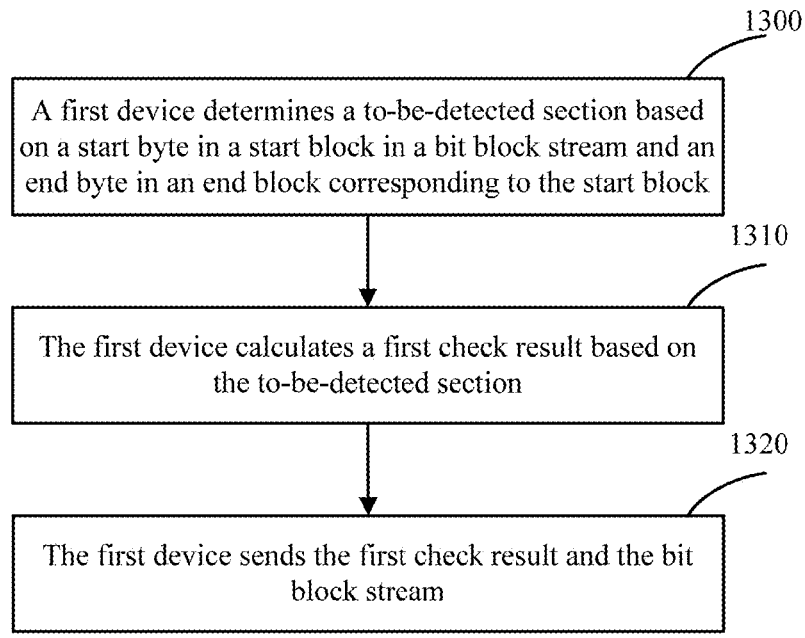
FIG. 13 shows a bit block stream bit error detection method 3 according to an embodiment of this application.

Referring to FIG. 13, an embodiment of this application provides a bit block stream bit error detection method, to resolve problems of relatively high implementation difficulty and relatively low bearer efficiency of a bit error detection method in an M/N bit block switching scenario. The method includes the following steps.

Step 1300: A first device determines a to-be-detected section based on a start byte in a start block in a bit block stream and an end byte in an end block corresponding to the start block.

Figure 14:
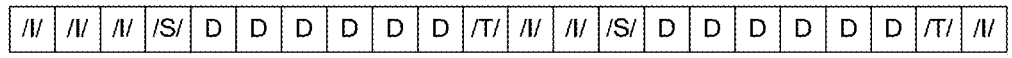
FIG. 14 is a schematic diagram of a 64/66 bit stream according to an embodiment of this application.
Figure 15:
FIG. 15 is a schematic diagram of a code type definition of a pure data block D according to an embodiment of this application.
Figure 16:
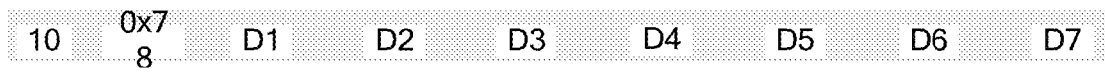
FIG. 16 is a schematic diagram of a code type definition of a start block according to an embodiment of this application.
Figure 17:
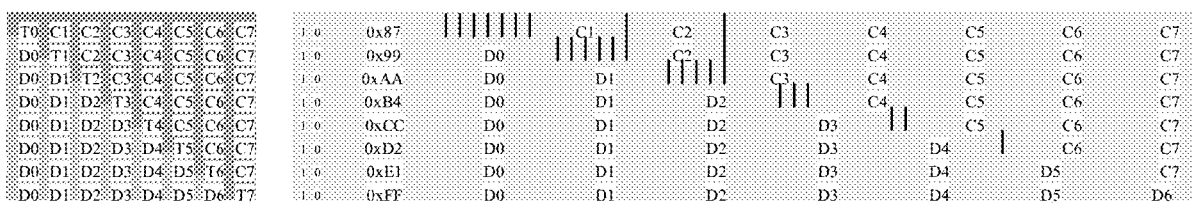
FIG. 17 is a schematic diagram of a code type definition of an end block according to an embodiment of this application.

As shown in FIG. 14, for a 64/66 bit stream, a user service starts with a start block marker /S/, and ends with an end block marker /T/, and D therebetween is a pure data block, which is specifically shown in FIG. 15. As shown in FIG. 1, row 7 corresponds to a code type definition of the start block, and S0 represents a start byte, which is specifically shown in FIG. 16. Rows 9 to 16 respectively correspond to eight code type definitions of the end block, and T0 to T7 represent end bytes, which are specifically shown in FIG. 17. For example, the end block includes T0, and then the to-be-detected section includes bytes between S0 and T0.

Step 1310: The first device calculates a first check result based on the to-be-detected section.

An algorithm used when the first device calculates the first check result may be CRC-x or BIP-x, the first check result is recorded as B, and B may be one or more bytes.

Step 1320: The first device sends the first check result and the bit block stream.

For step 1320, that the first device sends the first check result and the bit block stream may specifically include the following two possible implementations:

In a first possible implementation, the first device sends the first check result and the bit block stream to a second device.

In a second possible implementation, the first device sends the first check result to a third device, and sends the bit block stream to the second device.

It should be known that the first device herein is a bit block transmit end, the second device is a bit block receive end, and the third device is an SDN controller, or any device that has a function of determining a bit error in bit stream transmission.

In a possible implementation, before the first device sends the first check result and the bit block stream to the second device, the first device needs to store the calculated first check result. There are the following two possible storage manners.

Storage manner 1: The first device stores the first check result into the end block, to obtain an updated end block.

Figure 18:
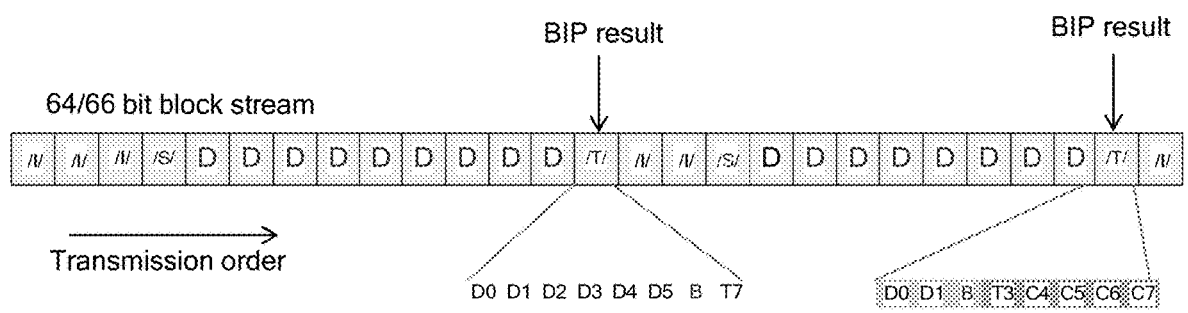
FIG. 18 is a schematic diagram of storing, by a first device, a first check result in an end block according to an embodiment of this application.

As shown in FIG. 18, that the first device stores the first check result into the end block specifically includes the following two scenarios.

Scenario 1: When a quantity of bytes occupied by the first check result is greater than or equal to a quantity of target bytes, the first device stores the first check result at a position before an end byte in the end block, moves the end byte into a newly added block after the end block based on the quantity of bytes occupied by the first check result, deletes any first bit block in the bit block stream, and uses the newly added block in which the end byte is located after being moved as an updated end block. The quantity of target bytes is 1 plus a quantity of bytes located after the end byte in the end block.

Scenario 2: When a quantity of bytes occupied by the first check result is less than the quantity of target bytes, the first device stores the first check result at a position before the end byte in the end block, backward moves, based on the quantity of bytes occupied by the first check result, the end byte by the quantity of bytes occupied by the first check result, and uses a bit block in which the end byte is located after being moved as an updated end block. The quantity of target bytes is 1 plus a quantity of bytes located after the end byte in the end block.

Figure 19:
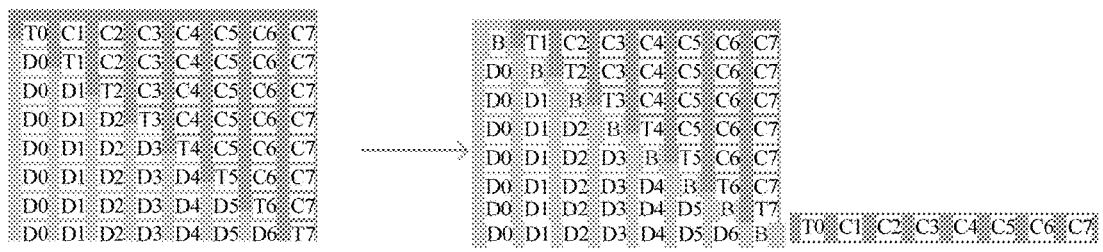
FIG. 19 is a schematic diagram of calculating, by a first device, a first check result B by using CRC-8 or BIP-8, and inserting the first check result B into an end block according to an embodiment of this application.

In an optional embodiment, as shown in FIG. 19, when the first device uses CRC-8 or BIP-8 to calculate the first check result B, B occupies only one byte.

When B is not inserted into the end block, and if the end block is D0 D1 D2 D3 D4 D5 D6 T7, the quantity of target bytes is 1; and after B is inserted, the end block is updated to D0 D1 D2 D3 D4 D5 D6 B, then a new block is added, and an updated end block is T0 C1 C2 C3 C4 C5 C6 C7.

When B is not inserted into the end block, and if the end block is T0 C1 C2 C3 C4 C5 C6 C7, the quantity of target bytes is 8; and after B is inserted, an updated end block is B T1 C1 C2 C3 C4 C5 C6. Likewise, when B is not inserted into the end block, and if end bytes included in the end block are T1 to T6 respectively, after B is inserted, the end bytes are correspondingly updated to T2 to T7.

Storage manner 2: The first device stores the first check result into a check result storage block, and deletes any first bit block in the bit block stream, where the check result storage block is a newly added block located before the end block, and the first bit block is a bit block that may be inserted into the bit block stream or deleted from the bit block stream in a transmission process of the bit block stream.

Figure 20:
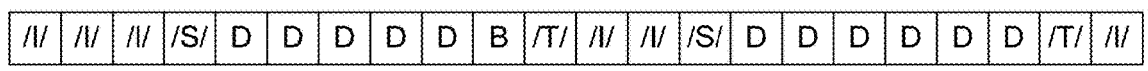
FIG. 20 is a schematic diagram of inserting, by a first device, a first check result B into a newly added bit block before an end block according to an embodiment of this application.

For example, a separate data block is allocated before the end block and next to the end block, to store the first check result B that is calculated by using CRC-x or BIP-x, where a type of the data block is D0 D1 D2 D3 D4 D5 D6 D7, which corresponds to a code type definition in row 1 in FIG. 1. D0 to D7 are used to store the calculated result B, and when B is inserted, an idle block (a block with an identifier /I/) after a block /T/ is deleted, to reduce impact on user bandwidth. As shown in FIG. 20, B occupies one separate block, and one idle block after /T/ is deleted.

Figure 21:
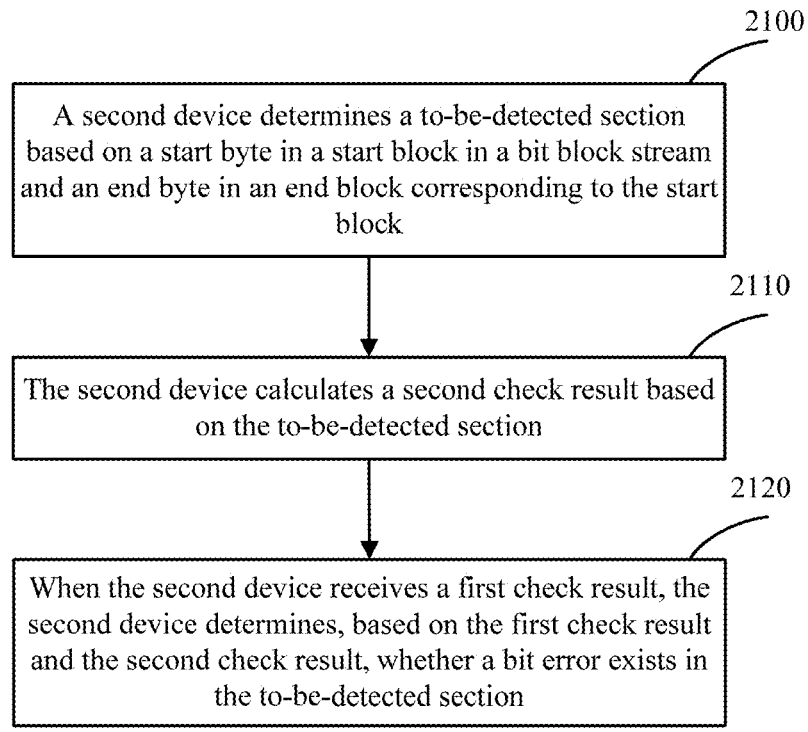
FIG. 21 shows a bit block stream bit error detection method 4 according to an embodiment of this application.

Referring to FIG. 21, an embodiment of this application provides a bit block stream bit error detection method, to resolve problems of relatively high implementation difficulty and relatively low bearer efficiency of a bit error detection method in an M/N bit block switching scenario. The method includes the following steps.

Step 2100: A second device determines a to-be-detected section based on a start byte in a start block in a bit block stream and an end byte in an end block corresponding to the start block.

For step 2100, that a second device determines a to-be-detected section based on a start byte in a start block in a bit block stream and an end byte in an end block corresponding to the start block includes the following three specific cases.

Case 1: If the second device receives a first check result, and the first check result is stored in the end block, the second device deletes a first check result from the end block, to obtain an updated end block, and uses bytes between the start byte in the start block and an end byte in the updated end block as the to-be-detected section.

Case 2: If the second device receives the first check result, and the first check result is stored in a check result storage block, the second device deletes the check result storage block from the bit block stream, to obtain an updated bit block stream, and uses bytes between the start byte in the start block in the updated bit block stream and the end byte in the end block as the to-be-detected section, where the check result storage block is located before the end block.

In the foregoing two cases, the first check result is included in the bytes between the start byte in the start block and the end byte in the end block. Therefore, the first check result needs to be first deleted, and a remaining part is used as the to-be-detected detection.

Case 3: If the second device does not receive the first check result, the second device uses bytes between the start byte in the start block in the bit block stream and the end byte in the end block as the to-be-detected section.

In this case, the first check result is not included in the bytes between the start byte in the start block and the end byte in the end block, so that the bytes can be directly used as the to-be-detected section.

Specifically, in a possible implementation, if the second device does not receive the first check result, the second device sends the second check result to a third device, and the third device stores the first check result. The third device is an SDN controller, or any device that has a function of determining a bit error in bit stream transmission.

Step 2110: The second device calculates a second check result based on the to-be-detected section.

Likewise, an algorithm used when the second device calculates the second check result is the same as that used when a first device calculates the first check result.

Step 2120: When the second device receives a first check result, the second device determines, based on the first check result and the second check result, whether a bit error exists in the to-be-detected section.

Specifically, if the second device determines that the first check result is the same as the second check result, the second device determines that no bit error exists in the to-be-detected detection; or if the second device determines that the first check result is different from the second check result, the second device determines that a bit error exists in the to-be-detected section.

Further, that the second device deletes the first check result from the end block, to obtain an updated end block specifically includes the following two scenarios:

Scenario 1: When a quantity of bytes occupied by the first check result is greater than or equal to a quantity of target bytes, the second device moves the end byte into a bit block before the end block based on the quantity of bytes occupied by the first check result, adds a new first bit block to the bit block stream, and uses the bit block in which the end byte is located after being moved as an updated end block. The quantity of target bytes is 1 plus a quantity of bytes located before the end byte in the end block.

Scenario 2: When a quantity of bytes occupied by the first check result is less than the quantity of target bytes, the first device forward moves, based on the quantity of bytes occupied by the first check result, the end byte by the quantity of bytes occupied by the first check result, and uses a bit block in which the end byte is located after being moved as an updated end block. The quantity of target bytes is 1 plus a quantity of bytes located before the end byte in the end block.

Figure 22:
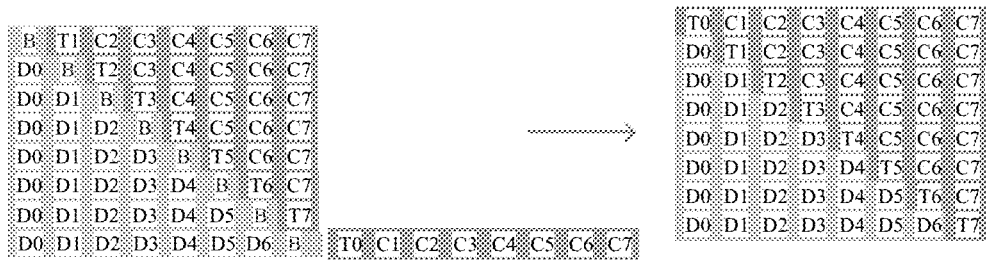
FIG. 22 is a schematic diagram of deleting, by a second device, a first check result B from an end block according to an embodiment of this application.

As shown in FIG. 22, when the first device uses CRC-8 or BIP-8 to calculate a first check result B, B occupies only one byte.

When the end block is B T1 C1 C2 C3 C4 C5 C6, the quantity of target bytes is 2. After B is deleted, an updated end block is T0 C1 C2 C3 C4 C5 C6 C7. Likewise, if end bytes included in the end block are T2 to T7 respectively, after B is deleted, the end bytes are correspondingly updated to T1 to T6.

When the end block is T0 C1 C2 C3 C4 C5 C6 C7, a data block next to the end block is D0 D1 D2 D3 D4 D5 D6 B, a quantity of target bytes is 1, and after B is deleted, an updated end block is D0 D1 D2 D3 D4 D5 D6 T7.

In addition, if the second device receives the first check result, and the first check result is stored in the check result storage block, the second device deletes the check result storage block from the bit block stream, to obtain the updated bit block stream, where the check result storage block is located before the end block. At the same time, to reduce impact on user bandwidth, a first bit block needs to be added after the end block.

By using the method provided in this embodiment of this application, error or bit error detection on a network path of an M/N bit block can be fully implemented, with little impact on a user service; bearer efficiency is close to bearer efficiency of SDH/OTN, and superior to bearer efficiency of an existing packet detection method; and an implementation procedure is simple, and easy to implement.

An embodiment of this application provides a new device for transferring an M1/M2 bit block stream, where a bit error detection unit, which is also referred to as a bit error rate (Bit error ratio, BER) unit, a BER for short, is newly added to the device. The unit is configured to calculate a check result and detect a bit error.

Figure 23A:
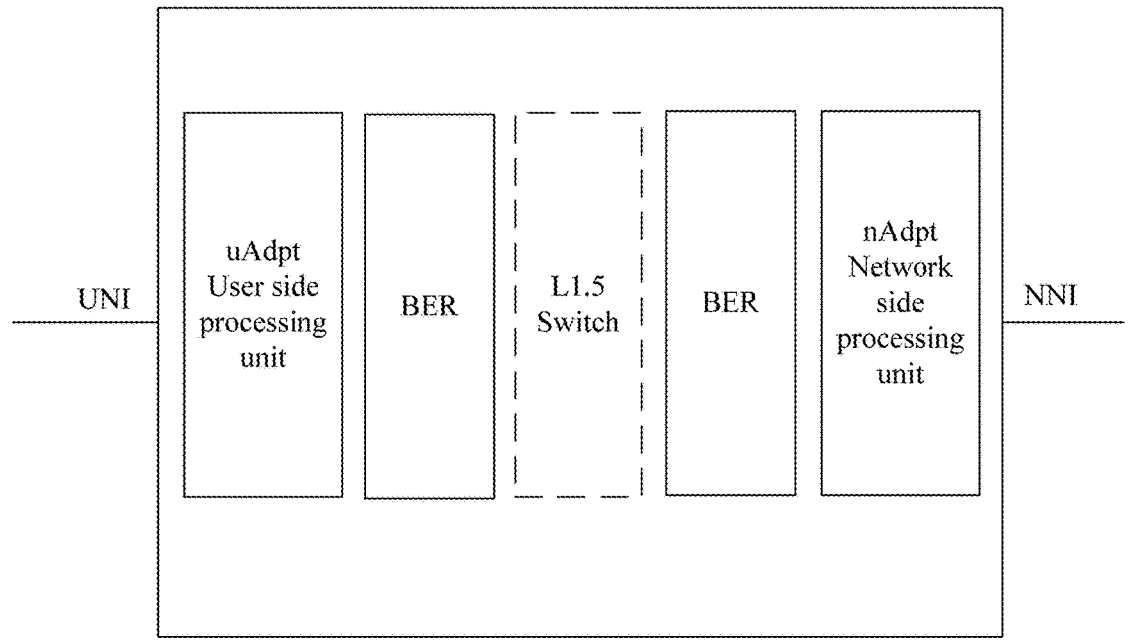
FIG. 23(a) is a schematic structural diagram 2 of a PE device according to an embodiment of this application.
Figure 23B:
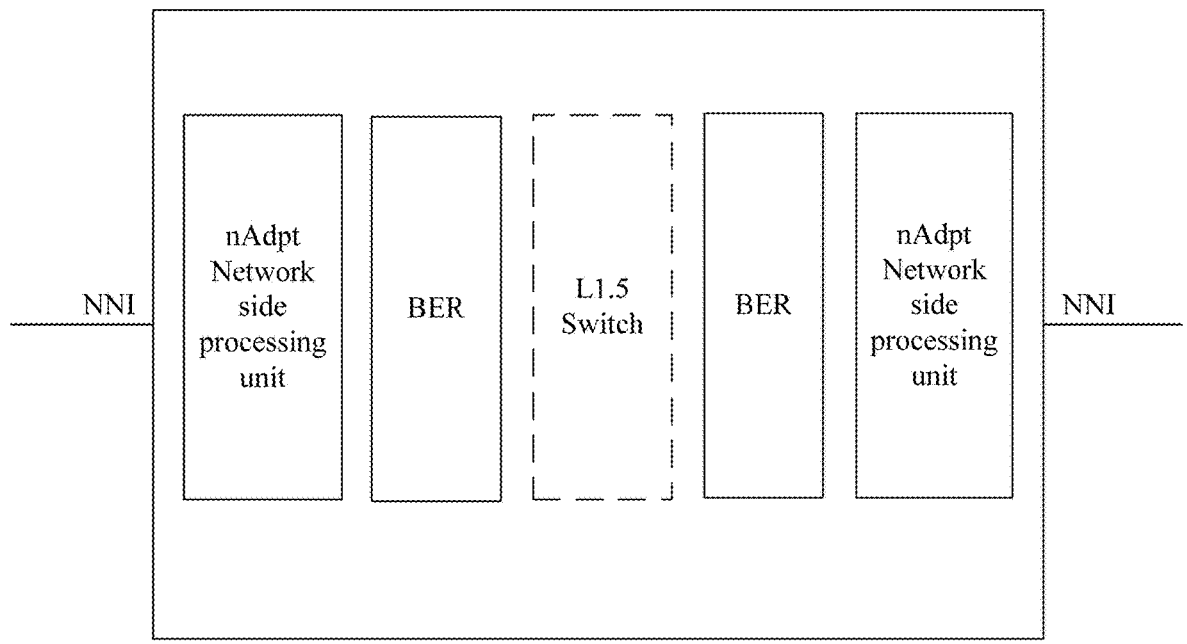
FIG. 23(b) is a schematic structural diagram 2 of a P device according to an embodiment of this application.

APE device includes a uAdpt, an L1.5 switch, an nAdpt, and a BER. One end of the PE device is connected to user equipment, an interface is a UNI, the other end is connected to a network device, and an interface is an NNI. A P device includes a uAdpt, an L1.5 switch, an nAdpt, and a BER, both ends of the P device are connected to a network device, and an interface is an NNI, as shown in FIG. 23(a) and FIG. 23(b).

Figure 24:
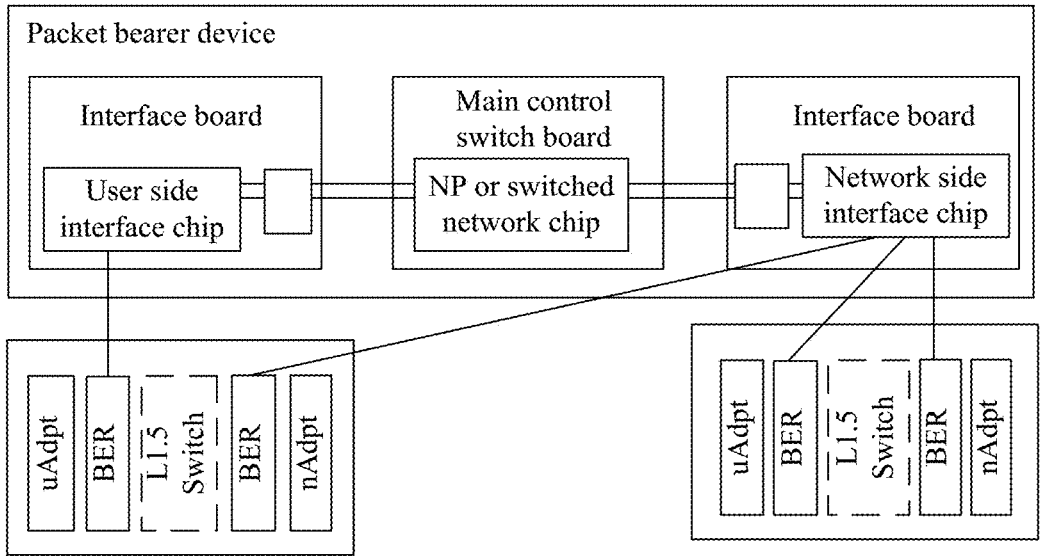
FIG. 24 is a schematic structural diagram 1 of a packet bearer product according to an embodiment of this application.

An embodiment of this application further provides a packet bearer product, for example, an IPRAN or PTN device for which an X-E characteristic is to be provided as planned. FIG. 24 shows the packet bearer product provided in this application, and an interface board herein may be an interface card of a box-type device or an interface chip of a line card of frame-shaped equipment.

Figure 25:
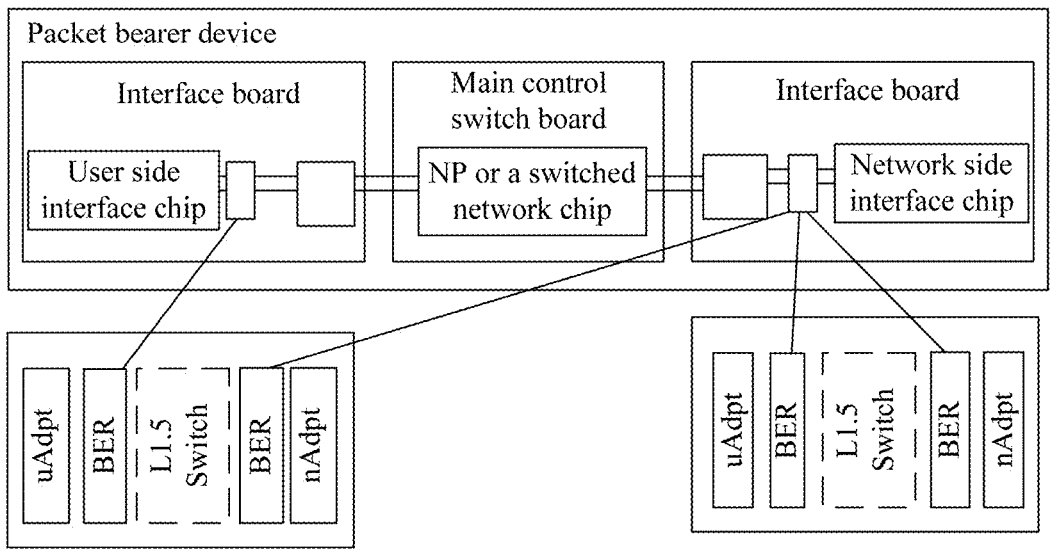
FIG. 25 is a schematic structural diagram 2 of a packet bearer product according to an embodiment of this application.

Alternatively, an embodiment of this application further provides a packet bearer product. As shown in FIG. 25, this application provides a new chip, such as an SDxxxx, that enables a BER to be built in the chip; or a field-programmable gate array (Field-Programmable Gate Array, FPGA) or a network processor (Network Processor, NP) is added between an existing interface chip such as an SDyyyy and a main control switch board, to implement a function of the BER by using the FPGA or the NP.

The following describes this embodiment of this application with reference to the accompanying drawings.

Figure 26:
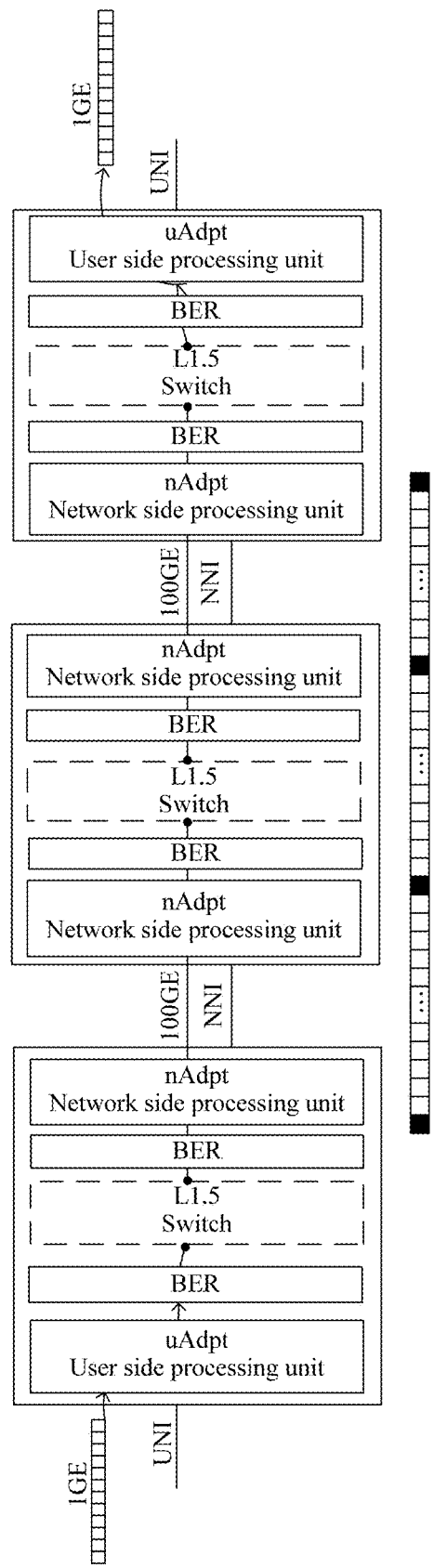
FIG. 26 is a schematic diagram of bit error detection in which a path of a to-be-checked bit block stream is an end-to-end path according to an embodiment of this application.

In an optional embodiment, referring to FIG. 26, a path of a to-be-checked bit block stream is an end-to-end path.

Embodiment 1: The embodiment shown in FIG. 26 is described by using an example in which a user side interface (UNI) is a 1GE interface, a network side interface (NNI) is a 100GE interface, three-terminal X-E devices are XE 1, XE 2, and XE 3, a switching granularity of an L1.5 switch and a network side signal stream are a 64/66 bit block stream, and one 8BIP-8 check result is inserted every 1024 blocks on a user side of the XE 1.

Step 1: 1GE user signals enter the XE 1 device from a UNI side, and a uAdpt converts an 8/10 bit block into a 64/66 bit block, which means that the uAdpt sequentially assembles eight 1GE user signals with a 2-bit synchronization header removed into one 64-bit string, and then adds a 2-bit synchronization header to form one 64/66 bit block, thereby finally forming a 64/66 bit block stream by using the method. A BER counts a quantity of blocks in the bit block stream from the uAdpt side, inserts a first boundary bit block at a position before the first bit block, and calculates a first check result set by using an 8BIP-8 algorithm. After the quantity of blocks reaches 1024 and the 1024 blocks are used as a first block group, the BER stores the first check result set into a bit block identified by 4B and 06, and inserts the bit block after the $1024^{th}$ bit block as a second boundary bit block. At the same time, the BER deletes an idle block from the bit block stream. The bit block stream processed by the BER enters the L1.5 switch, and then enters an nAdpt to be sent to a network side.

It should be known that, the BER continues counting the quantity of blocks, and calculates a first check result set of a second block group by using the 8BIP-8 algorithm, where a processing method is the same as that for the first block group. Then, the first check result set of the second block group is stored into a bit block identified by 4B and 06, and the bit block is inserted after the $2048^{th}$ bit block as a third boundary bit block. The BER repeats the foregoing process until the bit block stream ends.

Step 2: The bit block stream sent by the XE1 is transferred to an nAdpt of the XE 2, where receive clock frequency is slower than system clock frequency of the XE 1, and therefore the nAdpt of the XE2 needs to insert one or more idle blocks when sending the bit block stream to an L1.5 switch, to tolerate a transfer rate problem caused by clock frequency non-synchronization; and then the bit block stream is transferred to the network side XE 3.

Step 3: The bit block stream sent by the XE2 is transferred to the XE 3, where the bit block stream passes through an nAdpt and an L1.5 switch, and reaches a BER unit on a UNI side; and when receiving the first boundary bit block, the BER starts to perform 8BIP-8 parity check calculation on the bit block stream to be subsequently received, and when receiving the second boundary bit block inserted by the XE 1, the BER stops calculating, and uses bit blocks between the first boundary bit block and the second boundary bit block as a first block group. The BER compares a currently calculated second check result set with the first check result set stored in the second boundary bit block. If the two sets are consistent, the BER determines that no bit error exists; or if the two sets are inconsistent, the BER counts and stores a quantity of bit errors. At the same time, the BER deletes the second boundary bit block from the bit block stream, and inserts an idle block. After the bit block stream processed by the BER reaches a uAdpt, the uAdpt removes two synchronization header bits, divides 64 bits into eight 8-bit groups, adds a 2-bit synchronization header to each of the eight 8-bit groups, and then sequentially sends the eight 8-bit groups to a UNI link.

It should be known that the BER continues counting the quantity of blocks, and calculates a second check result set of the second block group by using the 8BIP-8 algorithm, where the second block group is bit blocks between the second boundary bit block and the third boundary bit block. When receiving the third boundary bit block inserted by the XE 1, the BER stops calculating. A processing method is the same as that for the first block group. The BER compares the currently calculated second check result set of the second block group with the first check result set that is of the second block group and that is stored in the third boundary bit block. If the two sets are consistent, the BER determines that no bit error exists; or if the two sets are inconsistent, the BER counts and stores a quantity of bit errors. The BER repeats the foregoing process until the bit block stream ends.

Therefore, the user signal enters the XE 1, is transferred through the XE 2, and flows out of a network from the XE 3, so that xBIP-y bit error detection is fully implemented on an entire end-to-end path, and an implementation is simple.

An idle block is added or deleted to compensate for a block that carries an xBIP-y result, with no impact on a user service, and bearer efficiency is 100%. There is a need to pass through an asynchronous node in a transfer process, and an idle block is inserted or deleted. The xBIP-y algorithm tolerates such a scenario, and ensures an accurate and effective check result.

In addition, the 8BIP-8 algorithm mentioned above may be replaced with a flexBIP-z algorithm by calculation.

The xBIP-y algorithm or the flexBIP-y algorithm is obviously superior to a static and rigid manner of Ethernet, SDH, or OTN that occupies fixed bytes. Because the first bit block is used for compensation, there is no impact on a user signal. However, for bit error or error detection of existing Ethernet, SDH, or OTN, fixed bytes are occupied, and user bandwidth is occupied. In an optional embodiment, referring to FIG. 27(a) and FIG. 27(b), a path of a to-be-checked bit block stream is a non-end-to-end path.

Figure 27A:
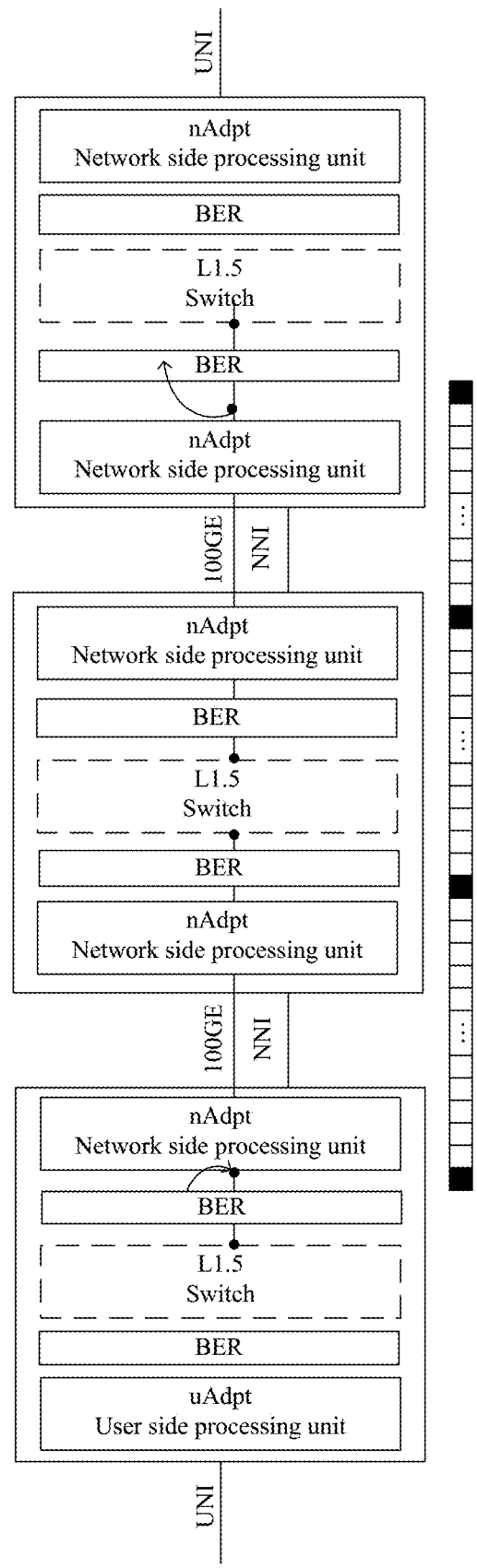
FIG. 27(a) is a schematic diagram 1 of bit error detection in which a path of a to-be-checked bit block stream is a non-end-to-end path according to an embodiment of this application.

It should be noted that, a unit that is located at a start end of a path shown in FIG. 27(a) and that calculates the first check result set and inserts the first check result set into the second boundary bit block is a BER on an nAdpt unit side, and a unit that is located at a termination end of the path and that calculates the second check result set and deletes the second boundary bit block is a BER on an nAdpt unit side.

In addition, no user signal is inserted or extracted on the path shown in FIG. 27(a), that is, the uAdpts at both ends do not need to perform a related operation.

Figure 27B:
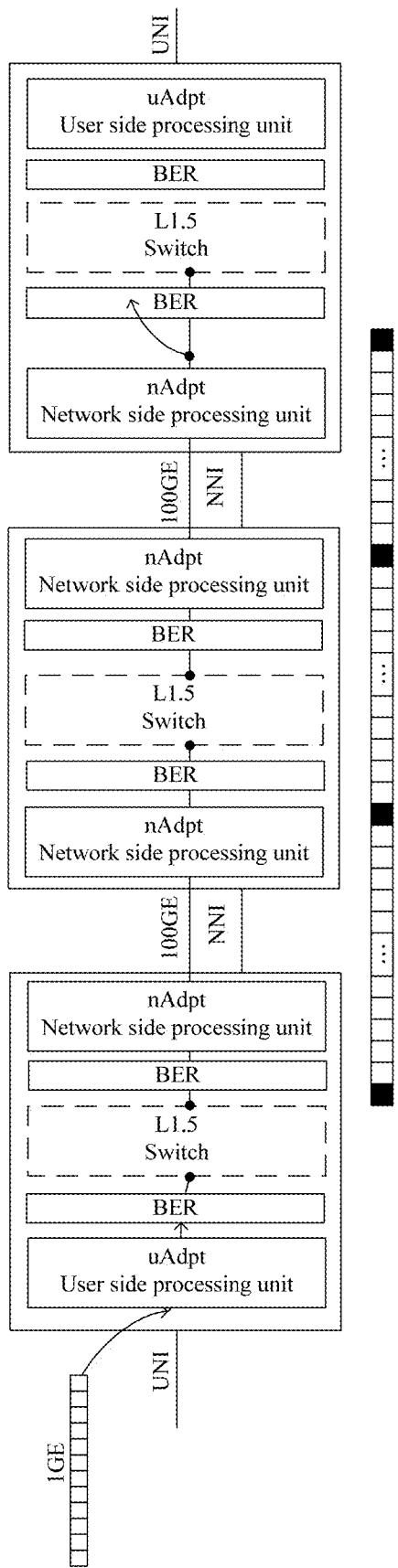
FIG. 27(b) is a schematic diagram 2 of bit error detection in which a path of a to-be-checked bit block stream is a non-end-to-end path according to an embodiment of this application.

A unit that is located at a start end of a path shown in FIG. 27(b) and that calculates the first check result set and inserts the first check result set into the second boundary bit block is a BER on a uAdpt unit side, and a unit that is located at a termination end of the path and that calculates the second check result set and deletes the second boundary bit block is a BER on an nAdpt unit side.

Moreover, the bit block stream on the path shown in FIG. 27(b) does not flow to an L1.5 switch and a uAdpt unit at the termination end.

Embodiment 2: The embodiment shown in FIG. 26 is described by using an example in which a user side interface (UNI) is a 1GE interface, a network side interface (NNI) is a 100GE interface, three-terminal X-E devices are XE 1, XE 2, and XE 3, a switching granularity of an L1.5 switch and a network side signal stream are a 64/66 bit block stream, and one BIP-8 result B1 is inserted into an end block on a user side of the XE 1.

Step 1: 1GE user signals enter the XE 1 device from a UNI side, and a uAdpt converts an 8/10 bit block into a 64/66 bit block, which means that the uAdpt sequentially assembles eight 1GE user signals with a 2-bit synchronization header removed into one 64-bit string, and then adds a 2-bit synchronization header to form one 64/66 bit block, thereby finally forming a 64/66 bit block stream by using the method. A BER identifies the bit block stream from the uAdpt side, starts to perform BIP-8 calculation when receiving a block with a start block identifier /S/, stops calculating when receiving a block with an end block identifier /T/, inserts the result B1 before /T/, and modifies a code type of /T/ at the same time. The bit block stream processed by the BER enters the L1.5 switch, and then enters an nAdpt to be sent to a network side.

It should be known that, the BER continues identifying the bit block stream from the uAdpt side, and repeats the foregoing process until the bit block stream ends.

Step 2: The bit block stream sent by the XE1 is transferred to an nAdpt of the XE 2, where receive clock frequency is slower than system clock frequency of the XE 1, and therefore the nAdpt of the XE2 needs to insert one or more idle blocks when sending the bit block stream to an L1.5 switch, to tolerate a transfer rate problem caused by clock frequency non-synchronization; and then the bit block stream is transferred to XE 3 on a network side.

Step 3: The bit block stream sent by the XE2 is transferred to the XE 3, where the bit block stream passes through an nAdpt and an L1.5 switch, and reaches a BER unit on a UNI side; the BER identifies the bit block stream, starts to perform BIP-8 calculation when receiving the block with the start block identifier /S/, when receiving the block with the end block identifier /T/, keeps calculating until the result B1 is found in the end block, deletes the result B1, and modifies the code type of /T/ at the same time. The BER compares a currently calculated result B2 with the result B1. If the two results are consistent, the BER determines that no bit error exists; or if the two results are inconsistent, the BER counts a quantity of bit errors and stores the bit error. After the bit block stream processed by the BER reaches a uAdpt, the uAdpt removes two synchronization header bits, divides 64 bits into eight 8-bit groups, adds a 2-bit synchronization header to each of the eight 8-bit groups, and then sequentially sends the eight 8-bit groups to a UNI link.

In addition, the BIP-8 algorithm mentioned above may be replaced with a CRC-8 algorithm by calculation.

Therefore, the user signal enters the XE 1, is transferred through the XE 2, and flows out of a network from the XE 3, so that CRC or BIP bit error detection is fully implemented on an entire end-to-end path, an implementation is simple, and bearer efficiency is improved in comparison with bearer efficiency of existing Ethernet, close to bearer efficiency of SDH and OTN, but still inferior to bearer efficiency of the embodiment 1 shown in FIG. 26.

Moreover, if the BER in step 1 inserts the result B1 in a separate block before the block /T/, and deletes an idle block after the block /T/, and if the BER in step 3 deletes the separate block, and adds an idle block after the block /T/ for compensation, there is no impact on a user service, and bearer efficiency is 100%.

The bit block stream bit error detection method provided in this embodiment of this application is a detection manner for a bit block stream transfer path, is not limited to telecommunication wired bearer, and can be fully applied to a wireless communication, industrial or industrial communication network.

Based on a same concept, this application further provides a bit block stream bit error detection device, where the device may be used to implement the foregoing corresponding method embodiment in FIG. 6. Therefore, for an implementation of the bit block stream bit error detection device provided in this embodiment of this application, refer to an implementation of the method. Same parts are not described again.

Figure 28:
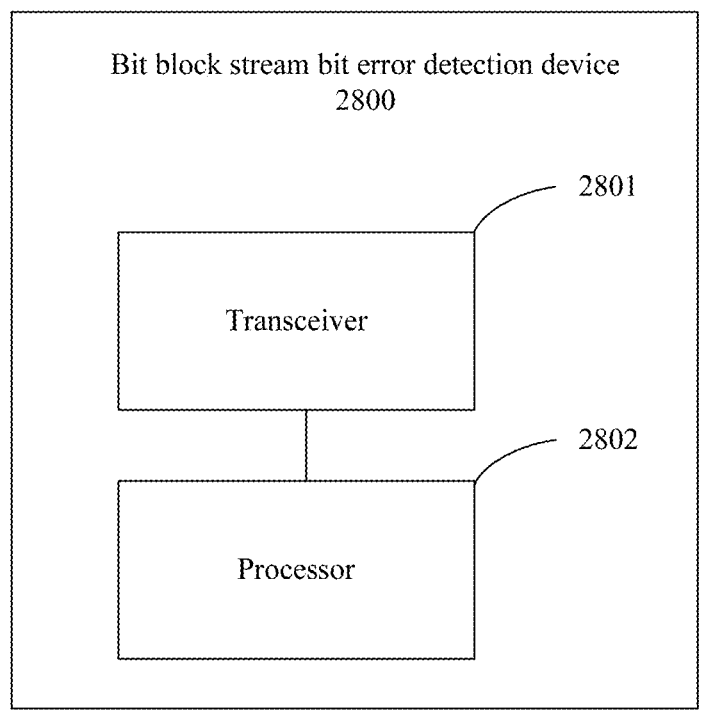
FIG. 28 is a schematic structural diagram 1 of a bit block stream bit error detection device according to an embodiment of this application.

Referring to FIG. 28, an embodiment of this application provides a bit block stream bit error detection device 2800, including: a transceiver 2801 and a processor 2802.

The transceiver 2801 is configured to send a first boundary bit block, where the first boundary bit block is used to distinguish N bit blocks to be subsequently sent, and N is a positive integer; and sequentially send an $I^{th}$ bit block, where I is an integer greater than or equal to 1 and less than or equal to N.

The processor 2802 is configured to determine a first parity check result and a second parity check result, where a check object of the first parity check result includes m consecutive bits of each bit block in the N bit blocks, a check object of the second parity check result includes n consecutive bits of each bit block in the N bit blocks, and at least one of m and n is greater than or equal to 2.

The transceiver 2801 is further configured to send a second boundary bit block, the first parity check result, and the second parity check result, where the second boundary bit block is used to distinguish the N bit blocks that have been sent.

In a possible design, a type of each bit block is an M1/M2 bit block, M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

In a possible design, the transceiver 2801 is configured to: send the first boundary bit block to a first device; sequentially send the $I^{th}$ bit block to the first device; and send the second boundary bit block, the first parity check result, and the second parity check result to the first device; or send the second boundary bit block to the first device, and send the first parity check result and the second parity check result to a second device.

In a possible design, the transceiver 2801 is configured to: send the second boundary bit block at a first moment, and send the first parity check result and the second parity check result at a second moment, where the first moment is earlier than the second moment, or the first moment is later than the second moment, or the first moment is the same as the second moment.

In a possible design, the first parity check result and the second parity check result are stored in the second boundary bit block.

In a possible design, the first parity check result and the second parity check result are calculated based on a preset check algorithm, where the preset check algorithm is used to keep the first parity check result and the second parity check result unchanged when a first bit block is added to or removed from the N bit blocks, and the first bit block is a bit block that may be inserted into the N bit blocks or deleted from the N bit blocks in a transmission process of the N bit blocks.

In a possible design, the preset check algorithm is an xBIP-y algorithm, where x indicates a quantity of consecutive bit-interleaved bits, x is determined based on a code type definition of the first bit block, y indicates a quantity of monitoring sections, x and y are positive integers, and y≥2.

The processor 2802 is configured to sequentially record every x consecutive bits of each bit block into a first monitoring section to a $y^{th}$ monitoring section from a first payload bit in the N bit blocks; and determine a 1-bit monitoring code for each monitoring section by using an odd parity check or an even parity check, to obtain a y-bit monitoring code, where the y-bit monitoring code includes the first parity check result and the second parity check result.

In a possible design, the preset check algorithm is a flexBIP-z algorithm, z indicates a quantity of monitoring sections, not all quantities of consecutive bit-interleaved bits corresponding to the monitoring sections are the same, and the quantities of consecutive bit-interleaved bits respectively corresponding to the z monitoring sections are A1, A2, A3, . . . , Az−1, and Az, where A1, A2, A3, . . . , Az−1, and Az, and z are positive integers, and z≥2.

The processor 2802 is configured to record A1 consecutive bits of each bit block into a first monitoring section from a first payload bit in the N bit blocks, record A2 consecutive bits after the A1 consecutive bits into a second monitoring section, and record A3 consecutive bits after the A2 consecutive bits into a third monitoring section, until Az consecutive bits after Az−1 consecutive bits are recorded into a $z^{th}$ monitoring section; and determine a 1-bit monitoring code for each monitoring section by using an odd parity check or an even parity check, to obtain a z-bit monitoring code, where the z-bit monitoring code includes the first parity check result and the second parity check result.

In a possible design, the processor 2802 is configured to: determine a first check result set, where the first check result set includes the y-bit monitoring code, or the first check result set includes the z-bit monitoring code; and the transceiver 2801 is configured to: send the first check result set.

Based on a same concept, this application further provides a bit block stream bit error detection device, where the device may be used to implement the foregoing corresponding method embodiment in FIG. 12. Therefore, for an implementation of the bit block stream bit error detection device provided in this embodiment of this application, refer to an implementation of the method. Same parts are not described again.

Figure 29:
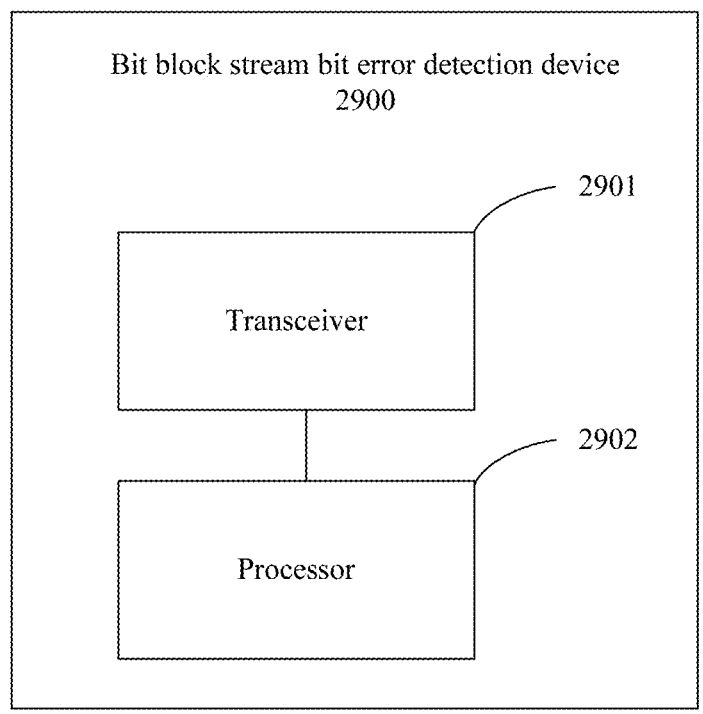
FIG. 29 is a schematic structural diagram 2 of a bit block stream bit error detection device according to an embodiment of this application.

Referring to FIG. 29, an embodiment of this application provides a bit block stream bit error detection device 2900, including: a transceiver 2901 and a processor 2902.

The transceiver 2901 is configured to receive a first boundary bit block, where the first boundary bit block is used to distinguish T bit blocks to be subsequently received, and T is a positive integer; and sequentially receive an $I^{th}$ bit block, where I is an integer greater than or equal to 1 and less than or equal to T; and receive a second boundary bit block, where the second boundary bit block is used to distinguish the T bit blocks that have already been received.

The processor 2902 is configured to determine a third parity check result and a fourth parity check result, where a check object of the third parity check result includes m consecutive bits of each bit block in the T bit blocks, a check object of the fourth parity check result includes n consecutive bits of each bit block in the T bit blocks, and at least one of m and n is greater than or equal to 2; and when a first parity check result and a second parity check result are received by using the transceiver, determine, based on the first parity check result and the third parity check result, and the second parity check result and the fourth parity check result, whether a bit error exists in the T bit blocks, where a check object of the first parity check result includes m consecutive bits of each bit block in N bit blocks, a check object of the second parity check result includes n consecutive bits of each bit block in the N bit blocks, and N indicates a quantity of bit blocks between the first boundary bit block and the second boundary bit block when the first parity check result and the second parity check result are determined.

In a possible design, the transceiver 2901 is further configured to: when a first parity check result and a second parity check result are not received, send the third parity check result and the fourth parity check result to a second device, where the second device stores the first parity check result and the second parity check result.

In a possible design, a type of each bit block is an M1/M2 bit block, M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

In a possible design, the transceiver 2901 is configured to: receive the second boundary bit block at a first moment; and receive the first parity check result and the second parity check result at a second moment, where the first moment is earlier than the second moment, or the first moment is later than the second moment, or the first moment is the same as the second moment.

In a possible design, the first parity check result and the second parity check result are stored in the second boundary bit block.

In a possible design, the third parity check result and the fourth parity check result are calculated based on a preset check algorithm, where the preset check algorithm is used to keep the third parity check result and the fourth parity check result unchanged when a first bit block is added to or removed from the T bit blocks, and the first bit block is a bit block that may be inserted into the T bit blocks or deleted from the T bit blocks in a transmission process of the T bit blocks.

In a possible design, the preset check algorithm is an xBIP-y algorithm, where x indicates a quantity of consecutive bit-interleaved bits, x is determined based on a code type definition of the first bit block, y indicates a quantity of monitoring sections, x and y are positive integers, and y≥2; and the processor 2902 is configured to sequentially record every x consecutive bits of each bit block into a first monitoring section to a $y^{th}$ monitoring section from a first payload bit in the T bit blocks; and determine a 1-bit monitoring code for each monitoring section by using an odd parity check or an even parity check, to obtain a y-bit monitoring code, where the y-bit monitoring code includes the third parity check result and the fourth parity check result.

In a possible design, the preset check algorithm is a flexBIP-z algorithm, z indicates a quantity of monitoring sections, not all quantities of consecutive bit-interleaved bits corresponding to the monitoring sections are the same, and the quantities of consecutive bit-interleaved bits respectively corresponding to the z monitoring sections are A1, A2, A3, . . . , Az−1, and Az, where A1, A2, A3, . . . , Az−1, and Az, and z are positive integers, and z≥2.

The processor 2902 is configured to record A1 consecutive bits of each bit block into a first monitoring section from a first payload bit in the T bit blocks, record A2 consecutive bits after the A1 consecutive bits into a second monitoring section, and record A3 consecutive bits after the A2 consecutive bits into a third monitoring section, until Az consecutive bits after Az−1 consecutive bits are recorded into a $z^{th}$ monitoring section; and determine a 1-bit monitoring code for each monitoring section by using an odd parity check or an even parity check, to obtain a z-bit monitoring code, where the z-bit monitoring code includes the third parity check result and the fourth parity check result.

In a possible design, the processor 2902 is configured to: if it is determined that the first parity check result is the same as the third parity check result, and the second parity check result is the same as the fourth parity check result, determine that no bit error exists in the T bit blocks; or if it is determined that the first parity check result is different from the third parity check result, and/or the second parity check result is different from the fourth parity check result, determine that a bit error exists in the T bit blocks.

In a possible design, the transceiver 2901 is configured to: receive a first check result set, where the first check result set is calculated based on an xBIP-y algorithm, and a y-bit monitoring code included in the first check result set includes the first parity check result and the second parity check result.

The processor 2902 is configured to determine a second check result set, where the second parity check result set is calculated based on the xBIP-y algorithm, and a y-bit monitoring code included in the second check result set includes the third parity check result and the fourth parity check result; and determine, based on the first check result set and the second check result set, whether a bit error exists in the T bit blocks.

In a possible design, the transceiver 2901 is configured to: receive a first check result set, where the first check result set is calculated based on a flexBIP-z algorithm, and a z-bit monitoring code included in the first check result set includes the first parity check result and the second parity check result.

The processor 2902 is configured to determine a second check result set, where the second check result set is calculated based on the flexBIP-z algorithm, and a z-bit monitoring code included in the second check result set includes the third parity check result and the fourth parity check result; and determine, based on the first check result set and the second check result set, whether a bit error exists in the T bit blocks.

In a possible design, the processor 2902 is configured to: if it is determined that the first check result set is the same as the second check result set, determine that no bit error exists in the T bit blocks; or if it is determined that the first check result set is different from the second check result set, determine that a bit error exists in the T bit blocks.

Based on a same concept, this application further provides a bit block stream bit error detection device, where the device may be used to implement the foregoing corresponding method embodiment in FIG. 13. Therefore, for an implementation of the bit block stream bit error detection device provided in this embodiment of this application, refer to an implementation of the method. Same parts are not described again.

Figure 30:
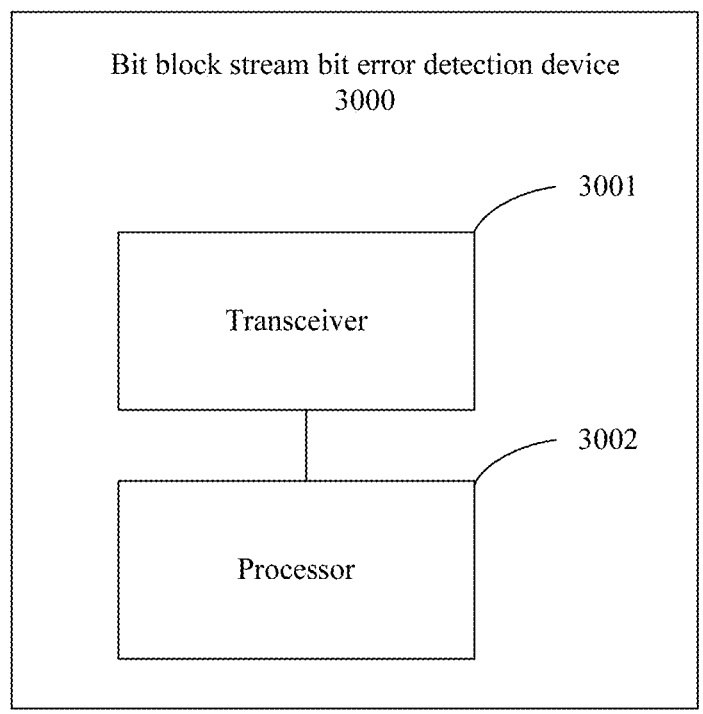
FIG. 30 is a schematic structural diagram 3 of a bit block stream bit error detection device according to an embodiment of this application.

Referring to FIG. 30, an embodiment of this application provides a bit block stream bit error detection device 3000, including: a transceiver 3001 and a processor 3002.

The processor 3002 is configured to determine a to-be-detected section based on a start byte in a start block in a bit block stream and an end byte in an end block corresponding to the start block; and calculate a first check result based on the to-be-detected section.

The transceiver 3001 is configured to send the first check result and the bit block stream.

In a possible design, the bit block stream includes at least one M1/M2 bit block, where M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

In a possible design, the transceiver 3001 is configured to: send the first check result and the bit block stream to a second device; or send the first check result to a third device, and send the bit block stream to the second device.

In a possible design, the processor 3002 is further configured to: before the transceiver sends the first check result and the bit block stream to the second device, store the first check result into the end block, to obtain an updated end block; or store the first check result into a check result storage block, and delete any first bit block in the bit block stream, where the check result storage block is a newly added block located before the end block, and the first bit block is a bit block that may be inserted into the bit block stream or deleted from the bit block stream in a transmission process of the bit block stream.

In a possible design, the processor 3002 is configured to: when a quantity of bytes occupied by the first check result is greater than or equal to a quantity of target bytes, store the first check result at a position before the end byte in the end block, move the end byte into a newly added block after the end block based on the quantity of bytes occupied by the first check result, delete any first bit block in the bit block stream, and use the newly added block in which the end byte is located after being moved as an updated end block; or when a quantity of bytes occupied by the first check result is less than the quantity of target bytes, store the first check result at a position before the end byte in the end block, backward move, based on the quantity of bytes occupied by the first check result, the end byte by the quantity of bytes occupied by the first check result, and use a bit block in which the end byte is located after being moved as an updated end block, where the quantity of target bytes is 1 plus a quantity of bytes located after the end byte in the end block.

Based on a same concept, this application further provides a bit block stream bit error detection device, where the device may be used to implement the foregoing corresponding method embodiment in FIG. 21. Therefore, for an implementation of the bit block stream bit error detection device provided in this embodiment of this application, refer to an implementation of the method. Same parts are not described again.

Figure 31:
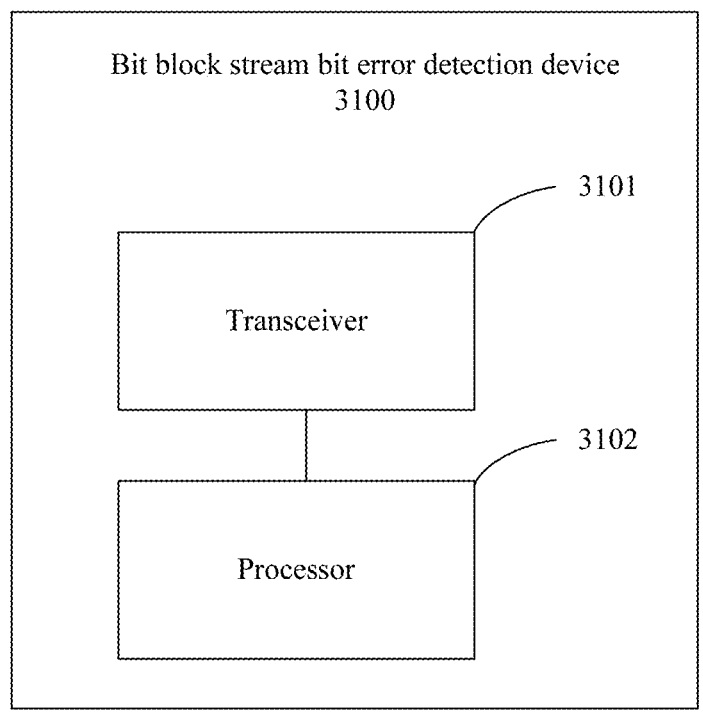
FIG. 31 is a schematic structural diagram 4 of a bit block stream bit error detection device according to an embodiment of this application.

Referring to FIG. 31, an embodiment of this application provides a bit block stream bit error detection device 3100, including: a transceiver 3101 and a processor 3102.

The processor 3102 is configured to determine a to-be-detected section based on a start byte in a start block in a bit block stream and an end byte in an end block corresponding to the start block; and calculate a second check result based on the to-be-detected section; and when a first check result is received by using the transceiver 3101, determine, based on the first check result and the second check result, whether a bit error exists in the to-be-detected section.

In a possible design, the bit block stream includes at least one M1/M2 bit block, where M1 indicates a quantity of payload bits in each bit block, M2 indicates a total quantity of bits in each bit block, M2−M1 indicates a quantity of synchronization header bits at a header of each bit block, M1 and M2 are positive integers, and M2>M1.

In a possible design, the processor 3102 is configured to: if the first check result is received by using the transceiver, and the first check result is stored in the end block, delete the first check result from the end block, to obtain an updated end block, and use bytes between the start byte in the start block and an end byte in the updated end block as the to-be-detected section; and if the first check result is received by using the transceiver, and the first check result is stored in a check result storage block, delete the check result storage block from the bit block stream, to obtain an updated bit block stream, and use bytes between the start byte in the start block in the updated bit block stream and the end byte in the end block as the to-be-detected section, where the check result storage block is located before the end block; or when the first check result is not received, use bytes between the start byte in the start block in the bit block stream and the end byte in the end block as the to-be-detected section.

In a possible design, the transceiver 3101 is further configured to: when the first check result is not received, send the second check result to a third device, where the third device stores the first check result.

In a possible design, the processor 3102 is configured to: if it is determined that the first check result is the same as the second check result, determine that no bit error exists in the to-be-detected section; or if it is determined that the first check result is different from the second check result, determine that a bit error exists in the to-be-detected section.

In a possible design, the processor 3102 is configured to: when a quantity of bytes occupied by the first check result is greater than or equal to a quantity of target bytes, move the end byte into a bit block before the end block based on the quantity of bytes occupied by the first check result, add a new first bit block to the bit block stream, and use a bit block in which the end byte is located after being moved as an updated end block; or when a quantity of bytes occupied by the first check result is less than the quantity of target bytes, forward move, based on the quantity of bytes occupied by the first check result, the end byte by the quantity of bytes occupied by the first check result, and use a bit block in which the end byte is located after being moved as an updated end block, where the quantity of target bytes is 1 plus a quantity of bytes located before the end byte in the end block.

In conclusion, the embodiments of this application provide a bit block stream bit error detection method, where the method includes: sending, by a transmitting device, a first boundary bit block, where the first boundary bit block is used to distinguish N bit blocks to be subsequently sent, and N is a positive integer; and sequentially sending an $I^{th}$ bit block, where I is an integer greater than or equal to 1 and less than or equal to N; determining a first parity check result and a second parity check result, where a check object of the first parity check result includes m consecutive bits of each bit block in the N bit blocks, a check object of the second parity check result includes n consecutive bits of each bit block in the N bit blocks, and at least one of m and n is greater than or equal to 2; and sending a second boundary bit block, the first parity check result, and the second parity check result, where the second boundary bit block is used to distinguish the N bit blocks that have been sent; in addition, receiving, by a receiving device, a first boundary bit block, where the first boundary bit block is used to distinguish T bit blocks to be subsequently received, and T is a positive integer; sequentially receiving an $I^{th}$ bit block, where I is an integer greater than or equal to 1 and less than or equal to T; receiving a second boundary bit block, where the second boundary bit block is used to distinguish the T bit blocks that have already been received; determining a third parity check result and a fourth parity check result, where a check object of the third parity check result includes m consecutive bits of each bit block in the T bit blocks, a check object of the fourth parity check result includes n consecutive bits of each bit block in the T bit blocks, and at least one of m and n is greater than or equal to 2; and when a first parity check result and a second parity check result are received, determining, based on the first parity check result and the third parity check result, and the second parity check result and the fourth parity check result, whether a bit error exists in the T bit blocks, where a check object of the first parity check result includes m consecutive bits of each bit block in N bit blocks, a check object of the second parity check result includes n consecutive bits of each bit block in the N bit blocks, and N indicates a quantity of bit blocks between the first boundary bit block and the second boundary bit block when the first parity check result and the second parity check result are determined. Therefore, by using the method provided in the embodiments of this application, error or bit error detection on a network path of an M/N bit block can be fully implemented, with no impact on a user service; bearer efficiency is 100%, and a bit block that is inserted or deleted due to synchronization in a transfer process can be tolerated; in addition, a detection period (that is, a quantity of bit blocks between the two boundary bit blocks) and detection precision (that is, a preset algorithm) can be dynamically configured according to a requirement. In addition, the detection method can not only be used for a to-be-checked bit block stream whose path is an end-to-end path, but can also be used for a to-be-checked bit block stream whose path is a non-end-to-end path. Therefore, the method provided in the embodiments of this application can be used to resolve problems of relatively high implementation difficulty and relatively low bearer efficiency of a bit error detection method in an M/N bit block switching scenario.

An embodiment of this application further provides a bit block stream bit error detection method, where the method includes: determining, by a first device, a to-be-detected section based on a start byte in a start block in a bit block stream and an end byte in an end block corresponding to the start block; and calculating, by the first device, a first check result based on the to-be-detected section; and sending, by the first device, the first check result and the bit block stream. For example, an algorithm used when the first device calculates the first check result may be CRC-x or BIP-x, the first check result is recorded as B, and B may be one or more bytes. A second device determines, based on the start byte in the start block in the bit block stream and the end byte in the end block corresponding to the start block, the to-be-detected section; and the second device calculates a second check result based on the to-be-detected section. When the second device receives the first check result, the second device determines, based on the first check result and the second check result, whether a bit error exists in the to-be-detected section. Therefore, by using the method provided in this embodiment of this application, error or bit error detection on a network path of an M/N bit block can be fully implemented, with little impact on a user service; bearer efficiency is close to bearer efficiency of SDH/OTN, and superior to bearer efficiency of a bit error detection method provided in the current technology; and an implementation procedure is simple, and easy to implement.

A person skilled in the art should understand that the embodiments of this application may be provided as a method, a system, or a computer program product. Therefore, the embodiments of this application may use a form of hardware only embodiments, software only embodiments, or embodiments with a combination of software and hardware. Moreover, the embodiments of this application may use a form of a computer program product that is implemented on one or more computer-usable storage media (including but not limited to a magnetic disk storage, a CD-ROM, an optical memory, and the like) that include computer-usable program code.

The embodiments of this application are described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer-readable memory that can instruct the computer or any other programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Obviously, a person skilled in the art can make various modifications and variations to the embodiments of this application without departing from the spirit and scope of this application. Therefore, this application is intended to cover these modifications and variations provided that they fall within the scope of protection defined by the following claims and their equivalent technologies.

What is claimed is:

1. A method, comprising:
    sending a first boundary bit block, wherein the first boundary bit block is usable to distinguish N bit blocks to be subsequently sent, and N is a positive integer;
    sequentially sending bit blocks of the N bit blocks until the N bit blocks are sent;
    determining a first parity check result and a second parity check result, wherein a check object of the first parity check result comprises m consecutive bits of each bit block in the N bit blocks, a check object of the second parity check result comprises n consecutive bits of each bit block in the N bit blocks, and m or n is greater than or equal to 2; and
    sending a second boundary bit block, the first parity check result, and the second parity check result, wherein the second boundary bit block is usable to distinguish the sent N bit blocks.

2. The method according to claim 1, wherein a type of each bit block is an M1/M2 bit block, M1 indicates a quantity of payload bits in each bit block, M2 indicates a total quantity of bits in each bit block, M2-M1 indicates a quantity of synchronization header bits at a header of each bit block, M1 and M2 are positive integers, and M2>M1.

3. The method according to claim 1, wherein the first parity check result and the second parity check result are calculated based on a preset check algorithm, the preset check algorithm is used to keep the first parity check result and the second parity check result unchanged when a first bit block is added to or removed from the N bit blocks, and the first bit block is insertable into the N bit blocks or deletable from the N bit blocks in a transmission process of the N bit blocks.

4. The method according to claim 3, wherein:
    the preset check algorithm is an xBIP-y algorithm, x indicates a quantity of consecutive bit-interleaved bits, x is determined based on a code type definition of the first bit block, y indicates a quantity of monitoring sections, x and y are positive integers, and y≥2; and
    determining the first parity check result and the second parity check result comprises:
        sequentially recording every x consecutive bits of each bit block into a first monitoring section to a $y^{th}$ monitoring section from a first payload bit in the N bit blocks; and
    determining a 1-bit monitoring code for each monitoring section using an odd parity check or an even parity check, to obtain a y-bit monitoring code, wherein the y-bit monitoring code comprises the first parity check result and the second parity check result.

5. The method according to claim 3, wherein:
    the preset check algorithm is a flexBIP-z algorithm, z indicates a quantity of monitoring sections, not all quantities of consecutive bit-interleaved bits corresponding to the monitoring sections are the same, and the quantities of consecutive bit-interleaved bits respectively corresponding to the z monitoring sections are A1, A2, A3, . . . , Az-1, and Az, wherein A1, A2, A3, . . . , Az-1, and Az, and z are positive integers, and z≥2; and
    determining the first parity check result and the second parity check result comprises:
        recording A1 consecutive bits of each bit block into a first monitoring section from a first payload bit in the N bit blocks, recording A2 consecutive bits after the A1 consecutive bits into a second monitoring section, and recording A3 consecutive bits after the A2 consecutive bits into a third monitoring section, until Az consecutive bits after Az-1 consecutive bits are recorded into a $z^{th}$ monitoring section; and
    determining a 1-bit monitoring code for each monitoring section using an odd parity check or an even parity check, to obtain a z-bit monitoring code, wherein the z-bit monitoring code comprises the first parity check result and the second parity check result.

6. The method according to claim 5, wherein:
    determining the first parity check result and the second parity check result comprises:
        determining a first check result set, wherein the first check result set comprises the y-bit monitoring code; and
    sending the first parity check result and the second parity check result comprises:
        sending the first check result set.

7. A method, comprising:
    receiving a first boundary bit block, wherein the first boundary bit block is usable to distinguish T bit blocks to be subsequently received, and T is a positive integer;
    sequentially receiving bit blocks of the T bit blocks until the T blocks are received;
    receiving a second boundary bit block, wherein the second boundary bit block is usable to distinguish the T bit blocks that have been received;
    determining a third parity check result and a fourth parity check result, wherein a check object of the third parity check result comprises m consecutive bits of each bit block in the T bit blocks, a check object of the fourth parity check result comprises n consecutive bits of each bit block in the T bit blocks, and m or n is greater than or equal to 2; and
    in response to a first parity check result and a second parity check result being received, determining, based on the first parity check result, the third parity check result, the second parity check result, and the fourth parity check result, whether a bit error exists in the T bit blocks, wherein a check object of the first parity check result comprises m consecutive bits of each bit block in N bit blocks, a check object of the second parity check result comprises n consecutive bits of each bit block in the N bit blocks, and N indicates a quantity of bit blocks between the first boundary bit block and the second boundary bit block when the first parity check result and the second parity check result are determined.

8. The method according to claim 7, wherein a type of each bit block is an M1/M2 bit block, M1 indicates a quantity of payload bits in each bit block, M2 indicates a total quantity of bits in each bit block, M2-M1 indicates a quantity of synchronization header bits at a header of each bit block, M1 and M2 are positive integers, and M2>M1.

9. The method according to claim 7, wherein the third parity check result and the fourth parity check result are calculated based on a preset check algorithm, the preset check algorithm is used to keep the third parity check result and the fourth parity check result unchanged when a first bit block is added to or removed from the T bit blocks, and the first bit block is a bit block that is insertable into the T bit blocks or deletable from the T bit blocks in a transmission process of the T bit blocks.

10. The method according to claim 9, wherein:
the preset check algorithm is an xBIP-y algorithm, x indicates a quantity of consecutive bit-interleaved bits, x is determined based on a code type definition of the first bit block, y indicates a quantity of monitoring sections, x and y are positive integers, and y≥2; and
determining the third parity check result and the fourth parity check result comprises:
sequentially recording every x consecutive bits of each bit block into a first monitoring section to a $y^{th}$ monitoring section from a first payload bit of the T bit blocks; and
determining a 1-bit monitoring code for each monitoring section using an odd parity check or an even parity check, to obtain a y-bit monitoring code, wherein the y-bit monitoring code comprises the third parity check result and the fourth parity check result.

11. The method according to claim 9, wherein:
the preset check algorithm is a flexBIP-z algorithm, z indicates a quantity of monitoring sections, not all quantities of consecutive bit-interleaved bits corresponding to the monitoring sections are the same, and the quantities of consecutive bit-interleaved bits respectively corresponding to the z monitoring sections are A1, A2, A3, . . . , Az-1, and Az, wherein A1, A2, A3, . . . , Az-1, and Az, and z are positive integers, and z≥2; and
determining the third parity check result and the fourth parity check result comprises:
recording A1 consecutive bits of each bit block into a first monitoring section from a first payload bit in the T bit blocks, recording A2 consecutive bits after the A1 consecutive bits into a second monitoring section, and recording A3 consecutive bits after the A2 consecutive bits into a third monitoring section, until Az consecutive bits after Az-1 consecutive bits are recorded into a $z^{th}$ monitoring section; and
determining a 1-bit monitoring code for each monitoring section using an odd parity check or an even parity check, to obtain a z-bit monitoring code, wherein the z-bit monitoring code comprises the third parity check result and the fourth parity check result.

12. The method according to claim 9, wherein receiving the first parity check result and the second parity check result comprises:

receiving a first check result set, wherein the first check result set is calculated based on an xBIP-y algorithm, and a y-bit monitoring code comprised in the first check result set comprises the first parity check result and the second parity check result;
determining the third parity check result and the fourth parity check result comprises:
determining a second check result set, wherein the second parity check result set is calculated based on the xBIP-y algorithm, and a y-bit monitoring code comprised in the second check result set comprises the third parity check result and the fourth parity check result; and
in response to receiving the first parity check result and the second parity check result are received, determining, based on the first parity check result, the third parity check result, the second parity check result, and the fourth parity check result, whether a bit error exists in the T bit blocks comprises:
determining, based on the first check result set and the second check result set, whether a bit error exists in the T bit blocks.

13. The method according to claim 12, wherein determining, based on the first check result set and the second check result set, whether a bit error exists in the T bit blocks comprises:
in response to determining that the first check result set is the same as the second check result set, determining that no bit error exists in the T bit blocks; or
in response to determining that the first check result set is different from the second check result set, determining that a bit error exists in the T bit blocks.

14. The method according to claim 9, wherein receiving the first parity check result and the second parity check result comprises:
receiving a first check result set, wherein the first check result set is calculated based on a flexBIP-z algorithm, and a z-bit monitoring code comprised in the first check result set comprises the first parity check result and the second parity check result;
the determining a third parity check result and a fourth parity check result comprises:
determining a second check result set, wherein the second check result set is calculated based on the flexBIP-z algorithm, and a z-bit monitoring code comprised in the second check result set comprises the third parity check result and the fourth parity check result; and
when the first parity check result and the second parity check result are received, the determining, based on the first parity check result and the third parity check result, and the second parity check result and the fourth parity check result, whether a bit error exists in the T bit blocks comprises:
determining, based on the first check result set and the second check result set, whether a bit error exists in the T bit blocks.

15. A device, comprising:
a transceiver;
a processor; and
a non-transitory computer-readable storage medium storing a program to be executed by the processor, the program including instructions for:
sending, using the transceiver, a first boundary bit block, wherein the first boundary bit block is usable to distinguish N bit blocks to be subsequently sent, and N is a positive integer;

sequentially sending, using the transceiver, bit blocks of the N bit blocks until the N bit blocks are sent;

determining a first parity check result and a second parity check result, wherein a check object of the first parity check result comprises m consecutive bits of each bit block of the N bit blocks, a check object of the second parity check result comprises n consecutive bits of each bit block of the N bit blocks, and m or n is greater than or equal to 2; and sending a second boundary bit block, the first parity check result, and the second parity check result, wherein the second boundary bit block is usable to distinguish the N bit blocks that have been sent.

16. The device according to claim 15, wherein a type of each bit block is an M1/M2 bit block, M1 indicates a quantity of payload bits in each bit block, M2 indicates a total quantity of bits in each bit block, M2-M1 indicates a quantity of synchronization header bits at a header of each bit block, M1 and M2 are positive integers, and M2>M1.

17. The device according to claim 15, wherein the first parity check result and the second parity check result are calculated based on a preset check algorithm, the preset check algorithm is used to keep the first parity check result and the second parity check result unchanged when a first bit block is added to or removed from the N bit blocks, and the first bit block is a bit block that is insertable into the N bit blocks or deletable from the N bit blocks in a transmission process of the N bit blocks.

18. The device according to claim 17, wherein:
the preset check algorithm is an xBIP-y algorithm, x indicates a quantity of consecutive bit-interleaved bits, x is determined based on a code type definition of the first bit block, y indicates a quantity of monitoring sections, x and y are positive integers, and y≥2; and
the program includes instructions for:
sequentially recording every x consecutive bits of each bit block into a first monitoring section to a $y^{th}$ monitoring section from a first payload bit in the N bit blocks; and determining a 1-bit monitoring code for each monitoring section using an odd parity check or an even parity check, to obtain a y-bit monitoring code, wherein the y-bit monitoring code comprises the first parity check result and the second parity check result.

19. The device according to claim 17, wherein:
the preset check algorithm is a flexBIP-z algorithm, z indicates a quantity of monitoring sections, not all quantities of consecutive bit-interleaved bits corresponding to the monitoring sections are the same, and the quantities of consecutive bit-interleaved bits respectively corresponding to the z monitoring sections are A1, A2, A3, . . . , Az-1, and Az, wherein A1, A2, A3, . . . , Az-1, and Az, and z are positive integers, and z≥2; and
the program includes instructions for:
recording A1 consecutive bits of each bit block into a first monitoring section from a first payload bit in the N bit blocks, record A2 consecutive bits after the A1 consecutive bits into a second monitoring section, and record A3 consecutive bits after the A2 consecutive bits into a third monitoring section, until Az consecutive bits after Az-1 consecutive bits are recorded into a $z^{th}$ monitoring section; and
determining a 1-bit monitoring code for each monitoring section using an odd parity check or an even parity check, to obtain a z-bit monitoring code, wherein the z-bit monitoring code comprises the first parity check result and the second parity check result.

20. The device according to claim 19, wherein the program includes instructions for:
determining a first check result set, wherein the first check result set comprises the z-bit monitoring code; and
sending, using the transceiver, the first check result set.

* * * * *